US006271150B1

(12) United States Patent
Croswell et al.

(10) Patent No.: US 6,271,150 B1
(45) Date of Patent: Aug. 7, 2001

(54) METHODS OF RAISING REFLOW TEMPERATURE OF GLASS ALLOYS BY THERMAL TREATMENT IN STEAM, AND MICROELECTRONIC STRUCTURES FORMED THEREBY

(75) Inventors: Robert T. Croswell; Arnold Reisman; Darrell L. Simpson, all of Raleigh; Dorota Temple, Cary; C. Kenneth Williams, Raleigh, all of NC (US)

(73) Assignees: North Carolina State University, Raleigh; MCNC, Research Triangle Park, both of NC (US)

( * ) Notice: Subject to any disclaimer, the term of this patent is extended or adjusted under 35 U.S.C. 154(b) by 0 days.

(21) Appl. No.: 09/201,447

(22) Filed: Nov. 30, 1998

(51) Int. Cl.$^7$ .................................................. H01L 21/324

(52) U.S. Cl. ......................... 438/760; 438/761; 438/783

(58) Field of Search .................................. 438/758, 760, 438/761, 763, 778, 781, 783, 795

(56) References Cited

U.S. PATENT DOCUMENTS

| 3,955,013 | * | 5/1976 | Kivlighn | 427/53 |
| 4,417,914 | | 11/1983 | Lehrer | 65/60.53 |
| 4,490,737 | | 12/1984 | Pierce et al. | 357/73 AJJ |
| 4,935,095 | | 6/1990 | Lehrer | 156/644 |
| 5,254,873 | | 10/1993 | Poon et al. | 257/751 |
| 5,378,662 | * | 1/1995 | Tsuyuki | 501/17 |
| 5,409,858 | * | 4/1995 | Thakur | 437/173 |
| 5,598,026 | | 1/1997 | Kapoor et al. | 257/634 |
| 5,646,075 | * | 7/1997 | Thakur | 437/247 |
| 5,705,409 | * | 1/1998 | Witek | 437/35 |
| 5,910,680 | * | 6/1999 | Maniar | 257/650 |

OTHER PUBLICATIONS

Hogarth et al., "D.C. and A.C. Electrical Properties of Vacuum Evaporated Thin SiO/GeO$_2$ Films", Journal of Materials Science, vol. 28, 1993, pp. 518–528.

Fisher et al., "Characterizing B–, P–, and Ge–Doped Silicon Oxide Films for Interlevel Dielectrics", Solid State Technology, Sep. 1993, pp. 55–64.

Baret et al., "Silica–Based Oxide Systems, I. Experimental and Calculated Phase Equilibria in Silicon, Boron, Phosphorus, Germanium, and Arsenic Oxide Mixtures", J. Electrochem. Soc., vol. 138, No. 9, Sep. 1991, pp. 2830–2835.

(List continued on next page.)

Primary Examiner—Stephen D. Meier
Assistant Examiner—David Goodwin
(74) Attorney, Agent, or Firm—Myers Bigel Sibley & Sajovec

(57) ABSTRACT

A layer of doped or undoped germanosilicate glass is formed on a substrate and the layer of germanosilicate glass is thermally treated in steam to remove germanium from the germanosilicate glass, and thereby raise the reflow temperature of the germanosilicate glass so treated. The layer of germanosilicate glass on the substrate may be a nonplanar layer of germanosilicate glass. When thermally treating the nonplanar layer of germanosilicate glass in steam, the layer of germanosilicate glass may be planarized simultaneously with the removal of germanium from the planarized germanosilicate glass. This process may be repeated to create a hierarchy of reflowed glass where each underlying layer reflows at a higher temperature than the next deposited glass layer. The steam thermal treatment step may be preceded by a thermal pretreatment of the layer of germanosilicate glass in at least one of a noble gas and nitrogen gas, to reflow the layer of germanosilicate glass. The thermal pretreating step may partially planarize the nonplanar layer of germanosilicate glass, and the thermal treating step may then fully planarize the partially planarized germanosilicate glass. Alternatively, the thermal pretreating step may fully planarize the layer of germanosilicate glass and the thermal treating step may then remove germanium from the fully planarized germanosilicate glass.

44 Claims, 5 Drawing Sheets

OTHER PUBLICATIONS

Baret et al., "Silica–Based Oxide Systems, II. Determination of Silica–Based, Low Flow Temperature Glasses for Electronic Application From Relations Between Glass Transition, Flow, and Liquidus Temperatures", J. Electrochem. Soc., vol. 138, No. 9, Sep. 1991, pp. 2836–2838.

Rastani et al., "Low Pressure Chemical Vapor Deposition of thin Film $GeO_2$–$SiO_2$ glasses", J. Electrochem. Soc., vol. 137, No. 4, Apr. 1990, pp. 1288–1296.

Sasi et al., "Electrical Conduction in Germanium Dioxide Thin Films", Phys. Stat. Sol. (a), 106, 1988, K41–K45.

Nourshargh et al., "Plasma Deposition of $GeO_2$/$SiO_2$ and $Si_3N_4$ Waveguides for Integrated Optics", IEE Proceedings, vol. 133, Pt. J, No. 4, Aug. 1986, pp. 264–266.

Ogino et al., "A Planarization Technique Utilizing Oxide Flow During $H_2$ Treatment of $SiO_2$–$GeO_2$ Film", Japanese Journal of Applied Physics, vol. 25, No. 7, Jul. 1986, pp. 1115–1120.

Huffman et al., "Thermochemistry and Structure of Low Pressure Chemically Vapor Deposited and Bulk $SiO_2$–$P_2O_5$ and $SiO_2$–$GeO_2$ Glasses", J. Electrochem. Soc, vol. 133, No. 2, Feb. 1986, pp. 431–439.

Levy et al., "Evaluation of the Phosphorus Concentration and Its Effect on Viscous Flow and Reflow in Phosphosilicate Glass", J. Electrochem Soc., vol. 132, No. 6, pp. 1472–1480.

Ogino et al., "A New Planarization Technique for LSI Fabrication Utilizing Si–Ge Film Oxidation", vol. 24, No. 1, Jan. 1985, pp. 95–101.

Huang et al., "Relationship Between Composition, Density and Refractive Index for Germania Silica Glasses", Journal of Non–Crystalline Solids, vol. 27, 1978, pp. 29–37.

Ray, "Composition–Property Relationships in Inorganic Oxide Glasses", Journal of non–Crystalline Solids, vol. 15, 1974, pp. 423–434.

Riebling, "Nonideal Mixing in Binary $GeO_2$–$SiO_2$ Glasses", Journal of the American Ceramic Society—Discussions and Notes, vol. 51, No. 5, Jul. 1968, pp. 406–407.

Fontana et al., "A Study of Viscosity—Temperature Relationships in the $GeO_2$ and $SiO_2$ Systems", Physics and Chemistry of Glasses, vol. 7, No. 4, Aug. 1996, pp. 139–146.

* cited by examiner

METHODS OF RAISING REFLOW TEMPERATURE OF GLASS ALLOYS BY THERMAL TREATMENT IN STEAM, AND MICROELECTRONIC STRUCTURES FORMED THEREBY

FEDERALLY SPONSORED RESEARCH

This invention was made with Government support under National Science Foundation Grant No. 9222487. The Government has certain rights to this invention.

FIELD OF THE INVENTION

This invention relates to methods of forming glass layers, and more particularly to methods of forming microelectronic glass layers, and microelectronic structures including the same.

BACKGROUND OF THE INVENTION

Glass layers are widely used in microelectronic devices. As the integration density of microelectronic devices continues to increase, it is desirable to provide higher performance glass layers.

Glass layers may provide insulating layers for microelectronic devices. For example, insulating layers may be used for trench isolation and interlayer dielectric regions in microelectronic devices. As is well known to those having skill in the art, trench isolation techniques are used to isolate microelectronic devices in a microelectronic substrate by forming a trench in the microelectronic substrate, between devices, and filling the trench with an insulating material. In interlayer dielectric applications, a layer of insulating material is used to separate conductive layers (often referred to as "wiring layers" or "metalization layers") from one another and from the microelectronic substrate. Glass layers also may be used for gate dielectrics, capacitor dielectrics and other microelectronic applications.

In both trench isolation and interlayer dielectric applications, it may be desirable for the insulating material to exhibit high dielectric breakdown strength, low dielectric constant and loss, minimal chemical attack on adjacent films, ease of deposition and etching, low stress, low charge density and/or good chemical stability. Moreover, an insulating material should reflow at relatively low temperatures, so as to obtain smooth or planar layers that can reduce nonplanarities that may be introduced during microelectronic device fabrication. In addition, if multiple interlayer dielectric layers are employed, it may be desirable that such layers provide a softening point hierarchy, at least with respect to the final layer that is deposited at any given point in the process.

Many types of glasses have been used as insulating materials in microelectronic applications. For example, silicon dioxide ($SiO_2$) has been used. Phosphosilicate glass (PSG) that incorporates phosphorus in the form of $P_2O_5$ into the pure $SiO_2$ material, has also been used. Borophosphosilicate glass (BPSG) that incorporates boron as $B_2O_3$ into PSG has also been used. Each of these glasses may have various advantages and disadvantages.

Germanosilicate glass, which is a solid solution of silicon dioxide ($SiO_2$) and germanium dioxide ($GeO_2$), has also been investigated as an insulating material. For example, in U.S. Pat. No. 4,417,914 to Lehrer, a method is provided for depositing a thin film binary glass which has a softening or flow point far below temperatures at which glass is normally used in connection with integrated circuits flow. After the binary glass has been deposited on a semiconductor substrate, it is heated and reflowed. Preferably, the glass comprises a mixture of germanium dioxide and silicon dioxide, wherein the germanium dioxide is no greater than approximately 50 mole percent of the mixture. Phosphorus is added to the glass film for passivation of the underlying devices. See the Lehrer abstract.

Another use of germanosilicate glass for microelectronic devices is described in a publication by Ogino et al. entitled "A New Planarization Technique for LSI Fabrication Utilizing Si—Ge Film Oxidation", Japanese Journal of Applied Physics, Vol. 24, No. 1, January 1985, pp. 95–101. A new planarization technique in the LSI process using Si—Ge film oxidation is proposed. An Si—Ge film is deposited by the thermal decomposition of $SiH_4$ and $GeH_4$ and then oxidized in wet $O_2$ ambient. During the oxidation, a large degree of fluidity appears below 800° C., a temperature much lower than that needed for phosphosilicate glass flow. The oxide growth rate is more than one order of magnitude higher than that in crystalline Si. The oxide thickness decreases with increasing Ge content and oxidation temperature, owing to Ge evaporation. The planarization is also related to Ge evaporation. After the entire Si—Ge film has been oxidized, neither glass flow nor Ge evaporation occur, even at temperatures higher than that of the oxidation. The electrical properties of the Si—Ge oxide film are good enough for its use as an insulating layer. The film does not react with an underlying $SiO_2$ or $Si_3N_4$ layer. See the Ogino et al. 1985 abstract.

In a subsequent publication entitled "A Planarization Technique Utilizing Oxide Flow During $H_2$ Treatment of a $SiO_2$—$GeO_2$ Film", Japanese Journal of Applied Physics, Vol. 25, No. 7, 1986, pp. 1115–1120, Ogino et al. describe that a large oxide flow has been found to appear when a $SiO_2$—$GeO_2$ mixed glass film is treated in a low-pressure $H_2$ gas at 900° C. Simultaneously, the greater part of the $GeO_2$ component is evaporated. The flow mechanism is explained by the diffusion and evaporation of GeO molecules produced by $GeO_2$ reduction. A planarization process utilizing this flow exhibits a large effect at low temperatures in comparison with phosphosilicate-glass flow. The oxide profile after a H2 treatment is no longer changed by a high-temperature treatment. The formed oxide is highly durable against acids. Electrical properties such as the dielectric constant, resistivity, and dielectric strength are comparable to those of a $SiO_2$ film grown by the thermal oxidation of Si. The problem of a small amount of Ge crystallized on the bottom of the oxide layer is controlled by a decrease in the $H_2$ pressure. See the Ogino et al. 1986 abstract.

Accordingly, germanosilicate glass holds promise for use in microelectronic devices as a potentially low reflow temperature layer with potentially high performance characteristics. It is also known that silicate glass can be doped with phosphorus and/or boron to further lower the reflow temperature thereof. However, notwithstanding this potential, there continues to be a need for improved methods of forming a layer of germanosilicate glass on a substrate and of using layers of germanosilicate glass in microelectronic devices.

SUMMARY OF THE INVENTION

According to one aspect of the present invention, a layer of germanosilicate glass is formed on a substrate and the layer of germanosilicate glass is thermally treated in steam to remove germanium from the germanosilicate glass, and thereby raise the reflow temperature of the germanosilicate glass so treated. It has been found that the steam may be used to remove germanium from the germanosilicate glass and can also improve the characteristics of the steam-annealed germanosilicate glass. In particular, the germanosilicate glass may be water insoluble after a steam anneal, over a wide range of composition variations. Moreover, in contrast with conventional anneals in hydrogen, the steam treated germanosilicate glass can have a smooth surface that is free of blowholes and other imperfections. Finally, although as-formed germanosilicate glass may have very high leakage current characteristics, low leakage current characteristics may be present after the steam treatment.

The layer of as deposited germanosilicate glass on the substrate may be a nonplanar (conformal or nonconformal) layer of germanosilicate glass. When thermally treating the nonplanar layer of germanosilicate glass in steam, the layer of germanosilicate glass may be planarized simultaneous with the removal of germanium from the planarized germanosilicate glass. The steam thermal treatment step may be preceded by a thermal pretreatment of the layer of germanosilicate glass in at least one of a noble gas and nitrogen gas, to reflow the layer of germanosilicate glass. The thermal pretreating step may partially planarize the nonplanar layer of germanosilicate glass, and the thermal treating step may then fully planarize the partially planarized germanosilicate glass. Alternatively, the thermal pretreating step may fully planarize the layer of germanosilicate glass and the thermal treating step may then remove germanium from the fully planarized germanosilicate glass. The thermal pretreating step also may further improve the electrical characteristics of the layer of germanosilicate glass, compared to the steam thermal treatment step alone.

The layer of germanosilicate glass is preferably formed on a substrate using Plasma Enhanced Chemical Vapor Deposition (PECVD) at about 200° C. In order to provide reduced reflow temperature while avoiding undesired crystallization of the germanosilicate glass layer and to provide water insolubility, the as-deposited layer of germanosilicate glass preferably has a mole percentage of germanium dioxide of between about 60% and about 85%. It has been found that at mole percentages below about 60%, it is difficult to planarize the germanosilicate glass at acceptable microelectronic device processing temperatures. Moreover, above about 85% mole percentage germanium dioxide, the thermally pretreated and/or thermally treated germanosilicate glass may at least partially undesirably crystallize.

More preferably according to the present invention, the layer of germanosilicate glass has a mole percentage of germanium dioxide of between about 77% and about 83%. Within this range, the germanosilicate glass can be planarized using thermal treatments in steam at acceptable microelectronic processing times and temperatures while avoiding unwanted crystallization behavior. For example, it has been found that a layer of germanosilicate glass having 80% mole percentage of germanium dioxide can be planarized at temperatures as low as 750° C. in six hours, at 800° C. in three hours, and at 850° C. in one hour.

According to another aspect of the present invention, a layer of doped germanosilicate glass is formed on a substrate, the doped germanosilicate glass having lower reflow temperature than undoped germanosilicate glass. The layer of doped germanosilicate glass is thermally treated in steam to remove germanium from the germanosilicate glass and thereby raise the reflow temperature of the doped germanosilicate glass so treated. The thermal treatment in steam also may remove some dopant. Accordingly, by using doped germanosilicate glass, even lower reflow temperatures may be obtained than was described above for undoped germanosilicate glass.

When boron is used to dope the germanosilicate glass, the boron-doped germanosilicate glass preferably has a mole percentage of germanium dioxide of between about 40% and about 85% relative to the silicon dioxide which encompasses reflow and crystallization boundaries, respectively, and a mole percentage of boron as $BO_{1.5}$ of between about 1% and about 4% relative to the total borogermanosilicate glass ($GeO_2+SiO_2+BO_{1.5}$). More preferably, the layer of boron-doped germanosilicable glass has a mole percentage of germanium dioxide of between about 77% and about 83% relative to the silicon dioxide and mole percentage of boron of about 3 percent relative to the total borogermanosilicate glass ($GeO_2+SiO_2+BO_{1.5}$).

Alternatively, a layer of phosphorous doped germanosilicate glass preferably has mole percentage of germanium dioxide of between about 60% and about 85% relative to silicon dioxide and mole percentages of phosphorous as $PO_{2.5}$ of between about 14% and about 44% relative to the total phosphogermanosilicate glass ($GeO_2+SiO_2+PO_{2.5}$). More preferably, the phosphorous doped germanosilicate glass has mole percentage of germanium dioxide relative to silicon dioxide of between about 55% and about 85% and mole percentage of phosphorous of about 14% of the total phosphogermanosilicate glass ($GeO_2+SiO_2+PO_{2.5}$).

More preferably, both boron and phosphorus are used in combination to dope the germanosilicate glass. The boron and phosphorus doped germanosilicate glass preferably has a mole percentage of germanium dioxide of between about 40% and about 85% relative to the silicon dioxide, a mole percentage of phosphorus as $PO_{2.5}$ of between about 5% and about 23%, and mole percentage of boron as $BO_{1.5}$ of between about 1% and about 4%, both relative to the total borophosphogermanosilicate glass ($GeO_2+SiO_2+PO_{2.5}+BO_{1.5}$). More preferably, the layer of boron and phosphorus doped germanosilicate glass has a mole percentage of germanium dioxide of between about 82% and about 85% relative to silicon dioxide, a mole percentage of phosphorus as $PO_{2.5}$ of between about 11% and about 14% and a mole percentage of boron as $BO_{1.5}$ of between about 1% and 3%, both relative to the total borophosphogermanosilicate glass ($GeO_2+SiO_2+PO_{2.5}+BO_{1.5}$).

Multiple germanosilicate glass layers may be formed on a substrate by forming a layer of germanosilicate glass on a substrate, thermally treating the layer of germanosilicate glass in steam to remove germanium from the germanosilicate glass and thereby raise the reflow temperature of the germanosilicate glass so treated, and repeating the steps of forming and thermally treating. A hierarchy of thermally treated germanosilicate glass layers is thereby created on the substrate, wherein each thermally treated germanosilicate glass layer has higher reflow temperature than the corresponding layer of germanosilicate glass as formed. Accordingly, in microelectronic device fabrication, wherein multiple insulating layers are often desired on a microelectronic substrate, the same material (such as germanosilicate glass) can be used for each layer, and thermally treated to raise the reflow temperature so that thermal treatment of an overlying layer will not cause additional flow in an underlying layer even when the originally deposited composition is the same.

In one embodiment, each of the forming and thermally treating steps are performed under the same conditions. Accordingly, multiple germanosilicate glass layers may be formed on a substrate using identical process conditions without causing an underlying layer to flow during formation and reflow of an overlying layer. In other applications, differing thermal conditions may be used in at least two of the repeated thermally treating steps. When forming multiple layers of germanosilicate glass, one or more of the layers may also be thermally pretreated in at least one of the noble gas and nitrogen gas to reflow the layer of germanosilicate glass as was described above. Each layer may be formed using PECVD as described above and may be doped or undoped germanosilicate glass having preferred mole percentage ranges as was described above.

The thermal treating step may be followed by the step of forming a conductive layer on the thermally treated layer of germanosilicate glass. The steps of forming a layer of germanosilicate glass, thermally treating and forming a conductive layer are repeatedly performed to thereby create a hierarchy of thermally treated germanosilicate glass layers on the substrate, that are separated by conductive layers, wherein each thermally treated germanosilicate glass layer has higher reflow temperature than the corresponding layer of germanosilicate glass as formed. In this application, the germanosilicate glass functions as an interlayer dielectric layer for a microelectronic device. In other applications, doped or undoped germanosilicate layers or other glass alloys may perform other functions in a microelectronic device including but not limited to masking layers, capping layers, trench isolation layers, passivating layers and high dielectric constant capacitor dielectrics.

The above described methods of repeatedly forming a layer and thermally treating the layer may be performed using glass other than germanosilicate glass, that includes at least two compounds in solid solution, one of which is volatilized by steam. The layer of glass is thermally treated in steam to remove at least some of the compound which is volatilized by steam and thereby raise the reflow temperature of the glass so treated. The steps of forming a layer of glass and thermally treating the layer of glass in steam are repeatedly performed to thereby create a hierarchy of thermally treated glass layers on the substrate wherein each thermally treated glass layer has higher reflow temperature than the corresponding layer of glass as formed. Examples of other germanium-containing glasses that may be used include germanostannate ($GeO_2+SnO_2$) and germanotitanate ($GeO_2+TiO_2$) glasses. These glasses may be particularly useful as high dielectric constant dielectric layers for integrated circuit capacitors, including trench capacitors and surface capacitors Microelectronic structures according to the invention include a microelectronic substrate and a plurality of layers of germanosilicate glass on the microelectronic substrate, the layers of germanosilicate glass comprising the same mole percentage germanium dioxide. A conductive layer may be included between adjacent layers of germanosilicate glass. Thus, multiple layers of germanosilicate glass, of the same mole percentage germanium dioxide may be used, for example for interlayer dielectric layers in an integrated circuit. The microelectronic substrate may also include a trench therein and a layer of germanosilicate glass in the trench. The layer of germanosilicate glass may comprise the same mole percentage germanium dioxide as the plurality of layers of germanosilicate glass on the microelectronic substrate.

In other embodiments, two different glasses may be used for two different purposes on a microelectronic substrate. For example, germanosilicate glass may be used for interlayer dielectric layers and germanostannate or germanotitanate glass may be used as the dielectric layer of a planar or trench capacitor. Accordingly, integrated circuits according to the invention may include planarized capacitor structures that use suitable alloys containing germanium dioxide.

Integrated circuits according to the invention may also include a capping layer on the outermost conductive layer opposite at least one underlying conductive layer. The capping layer may also comprise germanosilicate glass, preferably of the same mole percentage germanium dioxide as the plurality of layers of germanosilicate glass on the microelectronic substrate and/or in the trench. Integrated circuits according to the invention may also include a passivating layer that may comprise germanosilicate glass, preferably of the same mole percentage germanium dioxide as the plurality of germanosilicate glass layers on the microelectronic substrate and/or in the trench.

Intermediate products according to the present invention include a microelectronic substrate, a first layer of germanosilicate glass on the microelectronic substrate and a second layer of germanosilicate glass on the first layer of germanosilicate glass, opposite the microelectronic substrate. The second layer of germanosilicate glass comprises higher mole percentage germanium dioxide than the first layer of germanosilicate glass. In other words, the first layer of germanosilicate glass may be formed and thermally treated in steam to thereby remove germanium from the germanosilicate glass. The second layer of germanosilicate glass is the same as the first layer of germanosilicate glass as formed but has not yet been thermally treated to remove germanium from the germanosilicate glass. A conductive layer may be included between the first and second layers of germanosilicate glass. A trench may also be included, with a layer of germanosilicate glass in the trench. The layer of germanosilicate glass in the trench may comprise the same mole percentage germanium dioxide as the first layer of germanosilicate glass.

Accordingly, doped or undoped germanosilicate glass or other glass systems may be used for many purposes in microelectronic devices, including but not limited to interlayer dielectrics, capacitor dielectrics, gate dielectrics, isolation regions and capping layers. Improved surface and electrical characteristics may be obtained while allowing reflow at acceptably low temperatures and times.

DETAILED DESCRIPTION OF PREFERRED EMBODIMENTS

Figure 1A:
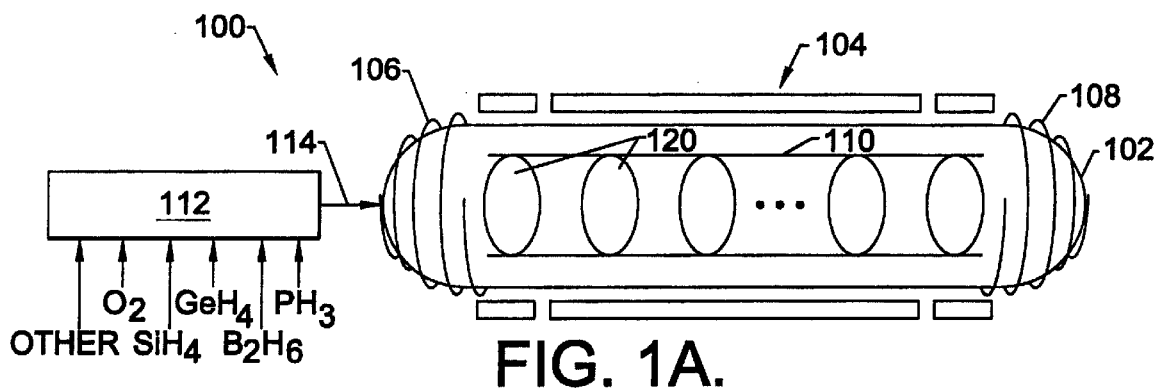
FIGS. 1A–1C illustrate overall methods of forming germanosilicate glass layers according to the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 1B:
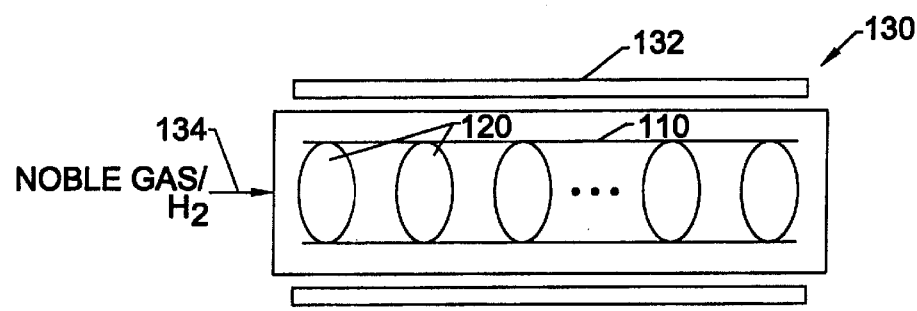
Figure 1C:
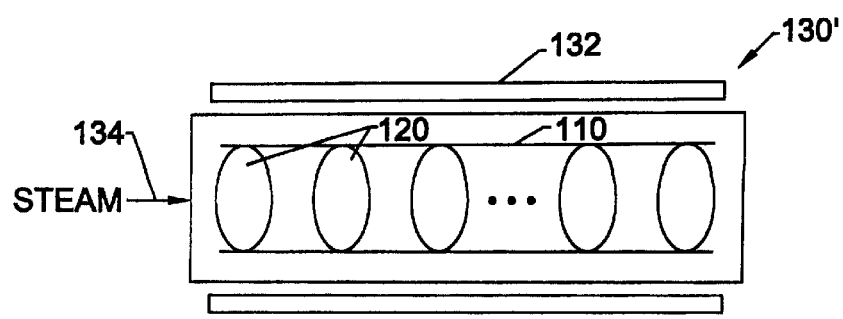

FIGS. 1A–1C illustrate overall methods of forming germanosilicate glass layers according to the invention. FIG. 1A illustrates forming a layer of germanosilicate glass on a substrate. As shown in FIG. 1A, germanosilicate glass may be formed on substrates using Plasma Enhanced Chemical Vapor Deposition (PECVD) in a PECVD Reactor System 100. The PECVD Reactor System 100 illustrated in FIG. 1A includes a reactor vessel 102 that is heated by three-zone heater 104 and in which plasma is generated by an upstream plasma coil 106 and a downstream plasma coil 108. A wafer boat 110, preferably a 14 rail two hemisphere boat, maintains the substrates 120 in spaced apart relation in the reactor vessel 102. A gas manifold 112 injects appropriate gases into the reactor vessel 102 via one or more injectors 114. Axial injectors, cross-flow shower injectors and/or other injectors may be used. When forming undoped germanosilicate glass, a flow of $SiH_4$ and $GeH_4$ and $O_2$ may be injected into the reactor vessel 102. When boron doping, a flow of $B_2H_6$ may be added. When phosphorous doping, a flow of $PH_3$ may be added. Other gasses including but not limited to carrier gasses may also be added as appropriate. PECVD of germanosilicate glass may take place at about 200° C.

The detailed design of PECVD Reactor System 100 is well known to those having skill in the art and need not be described further herein. It will also be understood that a layer of germanosilicate glass may be formed on substrates 120 using Low Pressure CVD (LPCVD), Atmospheric Pressure CVD (APCVD), spray coating, spin coating and other conventional methods well known to those having skill in the art. Preferably, the layer of germanosilicate glass is formed at temperatures that are sufficiently low so as not to unduly disturb the underlying structure of the substrate.

As shown in FIG. 1B, a layer of germanosilicate glass is thermally pretreated in at least one of a noble gas and nitrogen gas. Pretreating may take place in an annealing furnace 130 that is heated by heaters 132. One or more injectors 134 may provide a flow of a noble gas (a Group O element including helium, neon, argon, krypton, xenon and radon) and/or nitrogen gas. The design of the annealing furnace 130 is well known to those having skill in the art and need not be described further herein.

Referring now to FIG. 1C, a thermal treatment of the layer of germanosilicate glass in steam is performed to remove germanium from the germanosilicate glass and thereby raise the reflow temperature of the germanosilicate glass so treated. Thermal treatment may take in the same annealing furnace as was used for pretreatment in FIG. 1B. However, during the thermal treatment, steam is provided via one or more injectors 134. Accordingly, the annealing furnace is labeled 130' in FIG. 1C. As is understood by those having skill in the art, steam may be generated by pyrogenic combustion of hydrogen and oxygen. Other methods of generating steam may also be used, such as bubbling of carrier gas through a source of deionized water. Preferably, steam is generated that no excess hydrogen gas is present which may cause blow holes or other imperfections in the thermally treated layer of germanosilicate glass. It will also be understood by those having skill in the art that all the steps of FIGS. 1A–1C may take place in a single reactor vessel which is adapted for multiple uses. Moreover, different numbers of substrates 120 may be treated in each step of FIGS. 1A–1C, and different substrate holders 110 may be used.

Figure 2A:
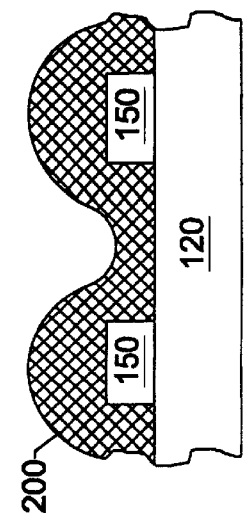
FIGS. 2A–2B illustrate a first embodiment of methods of forming germanosilicate glass layers on a substrate according to the invention.

Referring now to FIGS. 2A–2B, 3A–3C and 4A–4C, three embodiments of methods of forming a layer on a substrate will be described. Referring now to FIG. 2A, a microelectronic substrate 120 such as a monocrystalline silicon wafer, may include thereon microelectronic structures 150, for example gate electrodes or conductive lines, that cause the substrate 120 to have a nonplanar exposed surface. As shown in FIG. 2A, a layer of germanosilicate glass 200 is formed on the substrate, for example using the PECVD Reactor System 100 of FIG. 1A. The germanosilicate glass layer 200 as formed is indicated by cross hatching.

Figure 2B:
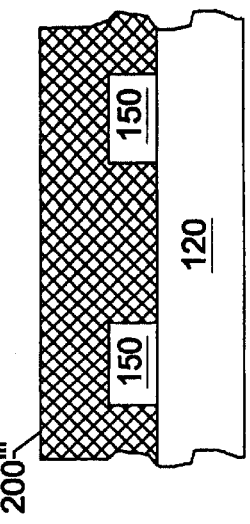

Referring now to FIG. 2B, the layer of germanosilicate glass 200 is thermally treated in steam, for example in the annealing system 130' of FIG. 1C, to remove germanium from the germanosilicate glass and thereby raise the reflow temperature of the germanosilicate glass so treated. The germanosilicate glass 200' with germanium removed is indicated by oblique hatching in FIG. 2B. As shown in FIG. 2B, the germanosilicate glass layer 200' is also planarized during the thermal treatment of FIG. 2B.

Figure 3A:
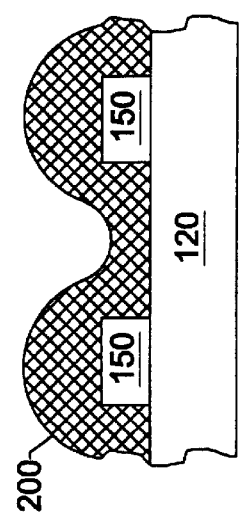
FIGS. 3A–3C illustrate a second embodiment of forming germanosilicate glass layers on a substrate according to the invention.
Figure 3B:
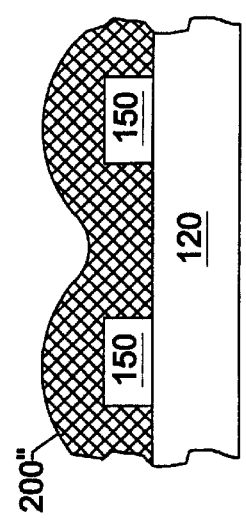
Figure 3C:
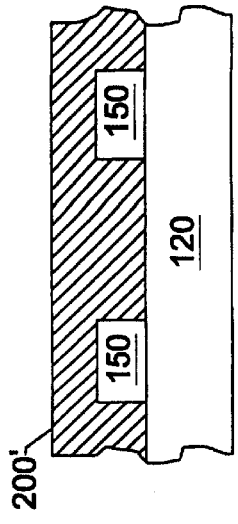

FIGS. 3A–3C illustrate an alternative embodiment wherein a layer of germanosilicate glass 200 is formed on a substrate 120 in FIG. 3A, similar to FIG. 2A. In FIG. 3B, the layer germanosilicate glass is thermally pretreated in at least one of a noble gas and nitrogen gas, for example using the annealing system 130 of FIG. 1B, to partially planarize the nonplanar layer of germanosilicate glass 200. The partially planarized layer of germanosilicate glass is indicated by 200". Since the composition has not changed from that of FIG. 3A, cross hatching is used. Then, referring to FIG. 3C, the partially planarized layer 200" of germanosilicate glass is thermally treated in steam, for example using the annealing furnace 130' of FIG. 1C, to remove germanium from the partially planarized germanosilicate glass and to fully planarize the partially planarized layer of germanosilicate glass.

Figure 4A:
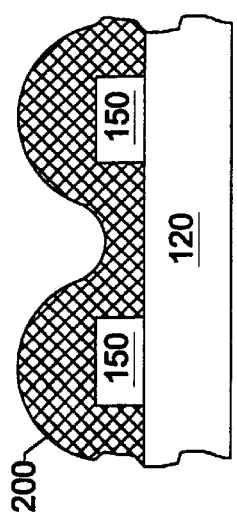
FIGS. 4A–4C illustrate a third embodiment of forming germanosilicate glass layers on a substrate according to the invention.
Figure 4B:
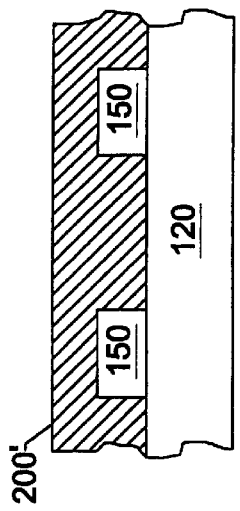
Figure 4C:
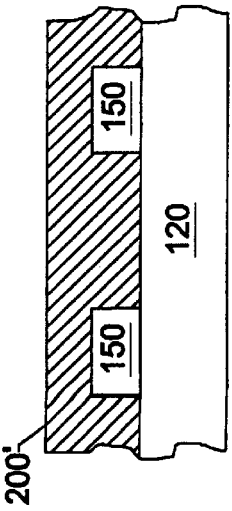

Yet another alternative is illustrated in FIGS. 4A–4C. In FIG. 4A, a layer of germanosilicate glass is formed on a substrate as was illustrated in FIGS. 2A and 3A. In FIG. 4B, the layer of germanosilicate glass is thermally pretreated in at least one of a noble gas and nitrogen gas to reflow the non-planar layer of germanosilicate glass and fully planarize the nonplanar layer of germanosilicate glass. The fully planarized layer is indicated by reference numeral 200'''. Then in FIG. 4C, thermal treatment in steam is performed to remove germanium from the fully planarized germanosilicate glass 200''' and thereby raise the reflow temperature of the germanosilicate glass 200' so treated.

Figure 5A:
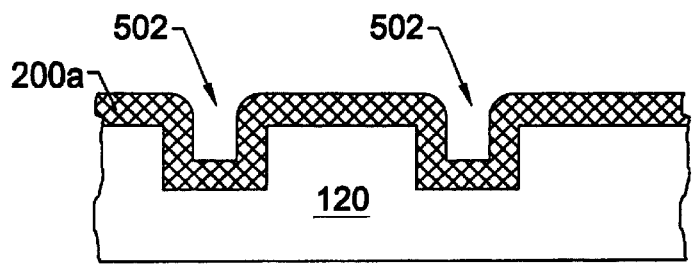
FIGS. 5A–5D illustrate methods of forming integrated circuits including multiple layers of germanosilicate glass, and intermediate product and final product integrated circuits so formed according to the invention.

Referring now to FIGS. 5A–5D, methods of forming integrated circuits including multiple layers of germanosilicate glass and integrated circuits so formed according to the invention will now be described. Referring now to FIG. 5A, a microelectronic substrate 120 including trenches 502 therein, is formed using conventional trench forming techniques. Then, as shown in FIG. 5A, a first layer of germanosilicate glass 200a is formed on the microelectronic substrate 120 including in the trenches 502, for example using a PECVD Reactor System 100 of FIG. 1A. As shown in FIG. 5A, the first germanosilicate glass layer 200a is nonplanar.

Figure 5B:
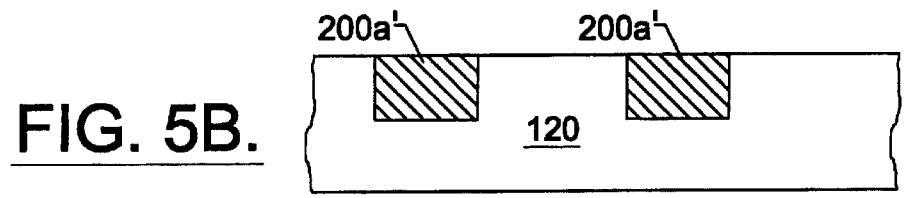

Then, referring to FIG. 5B, the first layer 200a of germanosilicate glass is optionally thermally pretreated in noble gas and/or nitrogen gas and thermally treated in steam to reflow the first layer of germanosilicate glass 200a and form a layer of germanosilicate glass 200a' in the trenches. Any of the methods of FIGS. 2A–2B, 3A–3C or 4A–4C may be used.

Preferably, the amount of germanosilicate glass that is deposited in the first layer 200a is controlled so that when the first layer 200a is reflowed to form the reflowed layer 200a' in the trenches, the germanosilicate glass that reflows into the trenches completely fills the trenches without excess. Accordingly, etching or chemical mechanical polishing of the substrate may not need to be used. It will also be understood that in calculating the amount of the first layer of germanosilicate glass 200a to be deposited, the shrinkage of the germanosilicate glass should be accounted for that results from the removal of germanium from the germanosilicate glass to thereby raise the reflow temperature of the germanosilicate glass.

Figure 5C:
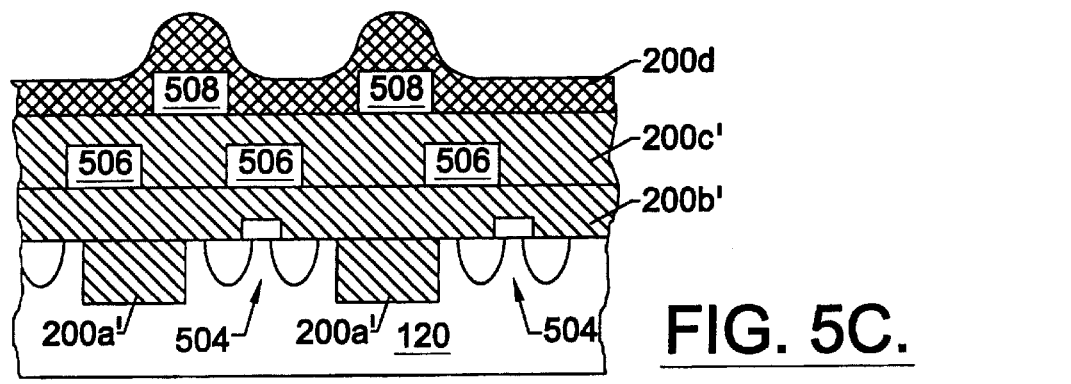

Referring now to FIG. 5C, microelectronic devices such field effect transistors 504 may be formed in the substrate 120 between the germanosilicate glass-filled trenches 200a' using conventional techniques. As also shown in FIG. 5C, a second layer of germanosilicate glass is then formed on the substrate and is thermally pre-treated and/or thermally treated as was described in FIGS. 2A–2B, 3A–3C or 4A–4C to produce a second treated germanosilicate glass layer 200b'. Additional microelectronic structures such as conductive lines 506, commonly referred to as first level metalization, may then be formed on second germanosilicate glass layer 200b' using conventional techniques. A third germanosilicate glass layer is then deposited and thermally pre-treated and/or treated to form a third treated germanosilicate glass layer 200c'.

Still continuing with the description of FIG. 5C, a second layer of microelectronic structures such as a second layer of conductive lines 508 may then be formed on the second germanosilicate glass layer 200c'. A third layer of germanosilicate glass 200d is then formed on the second layer 200c' and on the second conductive layer 508. As shown during this intermediate fabrication step, the trench filled with germanosilicate glass layer 200a' and the first and second germanosilicate glass layers 200b' and 200c' are indicated by oblique shading to indicate that germanium has been removed to thereby raise the reflow temperature of the germanosilicate glass so treated. In contrast, in the intermediate product of FIG. 5C, the third layer of germanosilicate glass 200d has not yet been thermally treated so that it has a lower reflow temperature than all the preceding layers of germanosilicate glass 200a', 200b' and 200c'. Thus, during the reflow of the third germanosilicate glass layer 200d, the first and second layers of germanosilicate glass 200b' and 200c' and the layer of germanosilicate glass in the trenches 200a' are not disturbed. Stated differently, the third layer of germanosilicate glass comprises a higher mole percentage of germanium dioxide compared to the underlying layers of germanosilicate glass.

Figure 5D:
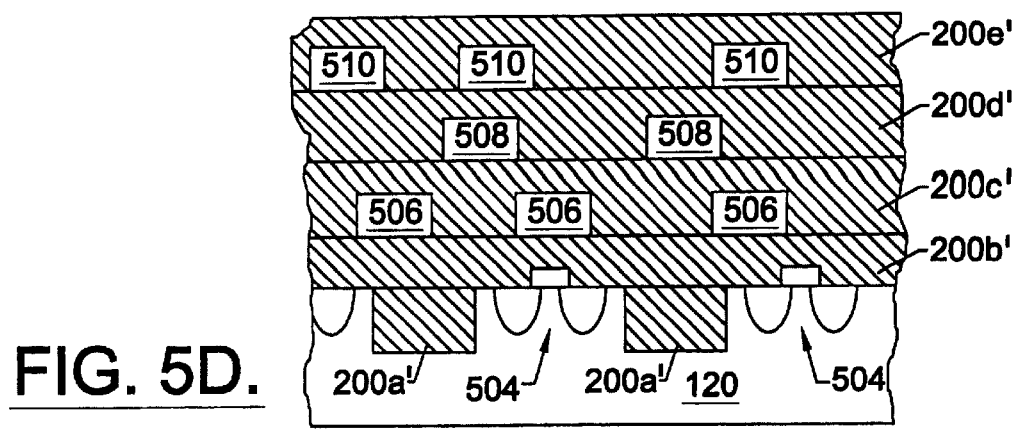

Referring now to FIG. 5D, the third layer of germanosilicate glass 200d is then thermally pretreated and/or thermally treated to form a planarized third layer 200d' with germanium removed. An outermost conductive layer 510 is then formed and an outer capping layer of germanosilicate glass 200e' is deposited and thermally pre-treated and/or thermally treated. Thus, germanosilicate glass is used to fill trenches 200a', for interlayer dielectric layers 200b'–200d' and as a capping layer 200e'.

Accordingly, as shown in FIGS. 5A–5D, a plurality of germanosilicate glass layers are formed on a substrate by repeatedly forming and thermally pretreating and/or treating a layer of germanosilicate glass to create a hierarchy of thermally treated germanosilicate glass layers on the substrate, wherein each thermally treated germanosilicate glass layer has higher reflow temperature than the corresponding layer of germanosilicate glass as formed. Different interlayer dielectric materials need not be used in order to provide a proper reflow hierarchy that will not reflow an underlying layer during subsequent reflow of an overlying layer. Rather, the same material may be used for all of the interlayer dielectric layers and thermally processed to raise the reflow temperature.

In order to simplify process conditions, each of the forming and thermally pretreating and/or treating steps may be performed under the same process conditions. Alternatively, however, at least two of the repeated thermally treating steps may be performed under differing thermal conditions. At least two of the forming and pretreating steps may also be performed under differing deposition and/or thermal conditions. Also, the trenches may be filled with germanosilicate glass of the same composition as are other germanosilicate glass layers. Different processing conditions may be provided to provide improved characteristics. Finally, the capping layer 200e' may also be formed of the same material using the same thermal conditions.

Still referring to FIG. 5D and viewed from a structural standpoint, microelectronic structures according to the invention include the microelectronic substrate 120 and the plurality of layers of germanosilicate glass 200a'–200d' on the microelectronic substrate. The layers of germanosilicate glass preferably comprise the same mole percentage germanium dioxide in the deposited state. The trenches are also preferably filled with a layer of germanosilicate glass 200a' which may comprise the same mole percentage as the plurality of layers of germanosilicate glass 200a'–200d'. A capping layer 200e' is also included on the outermost conductive layer 510. The capping layer 200e' may also comprise germanosilicate glass of the same mole percentage germanium dioxide. Accordingly, one material system may be used for many functions in fabricating integrated circuits, thereby reducing process complexity and allowing an increase in reliability. The same process conditions may be used for all the layers to provide additional simplicity and reliability.

It will also be understood that although FIGS. 2A–5D have been described with respect to undoped germanosilicate glasses, germanosilicate glasses doped with boron and/or phosphorous and/or other dopants may be used to further lower the reflow temperature and provide compatibility with low temperature fabrication of integrated circuits. Accordingly, doped or undoped germanosilicate glass layers may be used for many purposes in microelectronic devices, including but not limited to interlayer dielectrics, capacitor dielectrics, gate dielectrics, isolation regions and capping layers.

Figure 6A:
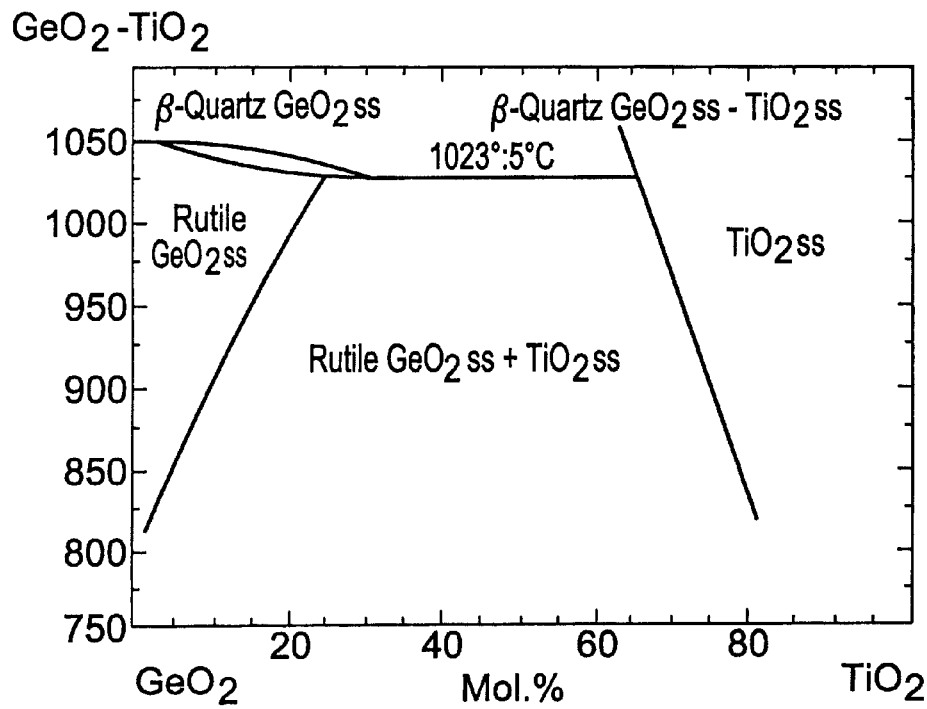
FIGS. 6A and 6B graphically illustrate crystalline phase diagrams for $GeO_2$—$TiO_2$ and $GeO_2$—$SnO_2$ respectively.
Figure 6B:
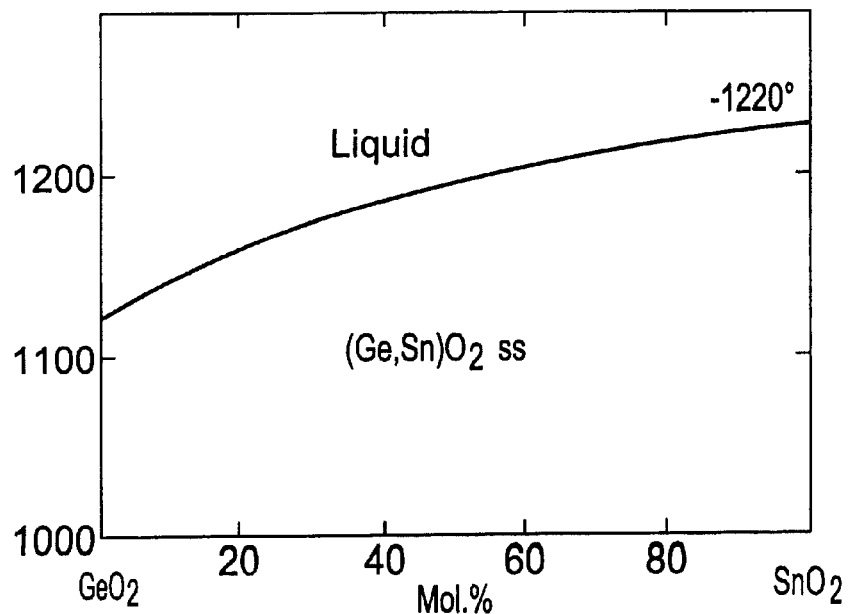

Other germanium-containing glass systems also may be used for these or other integrated circuit applications. For example, germanostannate ($GeO_2+SnO_2$) and or germanotitanate ($GeO_2+TiO_2$) glass systems may be used for integrated circuit capacitor applications. In each of these systems, the oxide other than germanium dioxide possesses a higher dielectric constant than germanium dioxide, at least in crystalline form. For example, the static dielectric constant for tin oxide parallel to the c-axis of the material is 14, while the dielectric constant perpendicular to the c-axis is 9.9. For titanium dioxide, the dielectric constant parallel to the c-axis of the material is 89, and the static dielectric constant perpendicular to the c-axis is 173. Moreover, both of these materials have a crystalline-phase diagram that shows a region of solid solution with germanium dioxide. See FIGS. 6A and 6B respectively. FIG. 6A is reproduced from Levin et al., *"Phase Diagrams for Ceramists"*, Vol. I, p. 141, The American Chemical Society, 1964. FIG. 6B is reproduced from Levin et al., *"Phase Diagrams for Ceramists"*, Vol. III, p. 165, The American Chemical Society, 1975.

For tin oxide, there appears to be complete miscibility with germanium dioxide. In contrast, titanium dioxide shows miscibility gaps below about 5 mole percent and above about 80 mole percent titanium dioxide. A glass-phase diagram may or may not show the same miscibility gaps. If the system does show these miscibility gaps, then these regions should be avoided after the thermal treatments.

As described above, for interlayer dielectric layers, it may be desirable to provide reduced dielectric constant and capacitance in order to reduce delays associated with signal propagation along conductive lines between the interlayer dielectric layers. However, for integrated circuit capacitor applications, high capacitance is generally desired. In capacitor applications, more capacitance can be achieved in the same area if a higher dielectric constant material is used.

Figure 7A:
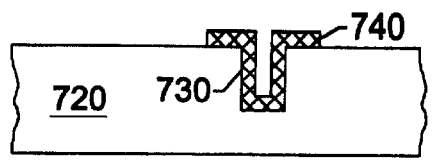
FIGS. 7A–7C are cross-sectional views illustrating fabrication of trench capacitors according to the present invention.
Figure 7B:
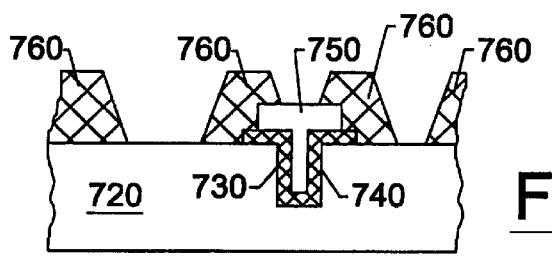
Figure 7C:
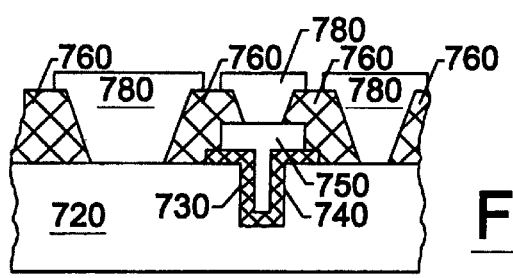

FIGS. 7A–7C illustrate fabrication of trench capacitors according to the present invention. As shown in FIG. 7A, a trench 730 is formed in a substrate 720. A conformal layer 740 comprising germanostannate and/or germanotitanate glass is codeposited, for example as described above with respect to germanosilicate glass. The layer 740 is then thermally pretreated and/or thermally treated in order to provide reflow if desired and also to remove at least some of the germanium dioxide and improve the electrical characteristics of the remaining material. The layer 740 is then patterned as shown in FIG. 7A, to thereby provide a lining of a deep trench capacitor. It will be understood that patterning may also take place before the thermal pretreatment and/or thermal treatment.

Referring now to FIG. 7B, the trench is then filled with a second electrode material such as doped polysilicon 750. A layer of germanosilicate glass 760 is then formed and thermally pretreated and/or treated to provide reflow, to remove germanium dioxide and to improve the electrical characteristics as described above. The layer of germanosilicate glass is then patterned. It will be understood that patterning may also take place before the thermal pretreatment and/or thermal treatment.

Then, referring to FIG. 7C, contacts such as aluminum contacts 780 are then formed to complete the trench capacitor structure. Conventional deposition and patterning techniques may be used.

Figure 8A:
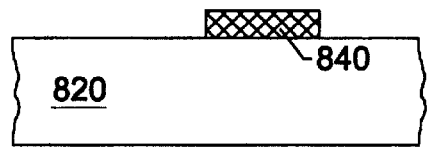
FIGS. 8A–8C are cross-sectional views illustrating fabrication of surface capacitors according to the present invention.
Figure 8B:
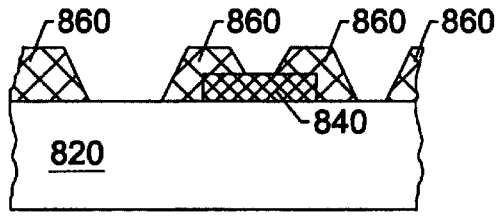
Figure 8C:
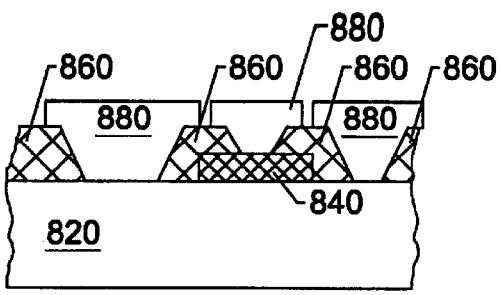

FIGS. 8A–8C illustrate fabrication of surface capacitors according to the present invention. As shown in FIG. 8A, a layer 840 comprising germanostannate and/or germanotitanate glass is formed on the surface of a substrate 820, thermally pretreated and/or treated and patterned. An insulating layer 860 comprising germanosilicate glass is then deposited and thermally pretreated and/or treated and patterned as shown in FIG. 8B. Contacts such as aluminum contacts 880 are then deposited and patterned as shown in FIG. 8C.

Quantitative results for pretreating and treating germanosilicate glass according to the invention will now be described. It will be understood that the following quantitative results are illustrative and shall not be construed as limiting the present invention. All percentages are given in mole percent.

Table 1 illustrates the step of thermally pretreating a layer of germanosilicate glass in argon. Times and temperatures are indicated in Table 1. It will be understood that the measurements indicated may be accurate within about ±3%. The following abbreviations are used:

NF No Flow
LF Low Flow
MF Moderate Flow
HF Heavy Flow
C Crystalline

TABLE 1

| Temp. | Solid Phase $GeO_2$ | | | | | | |
|---|---|---|---|---|---|---|---|
| | 100% | 90% | 80% | 60% | 50% | 40% | 20% |
| 600° C. | — | — | — | — | — | — | — |
| 650° C. | MF (1 hr)<br>LF C (12 hrs) | — | — | — | — | — | — |
| 700° C. | MF (1 hr)<br>LF C (12 hrs) | MF (1 hr)<br>LF C (12 hrs) | — | — | — | — | — |
| 750° C. | LF C (1 hr) | HF (1 hr)<br>LF C (12 hrs) | MF (1 hr)<br>Planar (6 hr)<br>Planar (12 hr) | NF (1 hr)<br>NF (12 hr) | — | — | — |
| 800° C. | — | LF C (1 hr) | HR (1 hr)<br>Planar (3 hr) | NF (1 hr)<br>NF (12 hr) | NF (1 hr)<br>NF (12 hr) | NF (1 hr)<br>NF (12 hr) | NF (1 hr)<br>NF (12 hr) |
| 850° C. | — | MF C (1 hr) | Planar (1 hr)<br>Planar (12 hr) | NF (1 hr)<br>MF (12 hr) | NF (1 hr)<br>NF (12 hr) | NF (1 hr)<br>NF (12 hr) | NF (1 hr)<br>NF (12 hr) |
| 900° C. | — | — | Planar (1 hr)<br>Planar (12 hr) | LF (1 hr)<br>HF (12 hr) | NF (1 hr)<br>NF (12 hr) | NF (1 hr)<br>NF (12 hr) | NF (1 hr)<br>NF (12 hr) |
| 950° C. | — | — | Planar (1 hr)<br>Planar (12 hr) | MF (1 hr)<br>LF (12 hr) | NF (1 hr)<br>NF (12 hr) | NF (1 hr)<br>NF (12 hr) | NF (1 hr)<br>NF (12 hr) |

TABLE 1-continued

| | Solid Phase GeO$_2$ | | | | | | |
|---|---|---|---|---|---|---|---|
| Temp. | 100% | 90% | 80% | 60% | 50% | 40% | 20% |
| 1000° C. | — | — | Planar (1 hr) Planar (12 hr) | HF (1 hr) ~Planar (12 hr) | MF (1 hr) MF (12 hr) | NF (1 hr) NF (12 hr) | NF (1 hr) NF (12 hr) |
| 1050° C. | — | — | Planar (1 hr) Planar (12 hr) | Planar (1 hr) Planar (12 hr) | MF (1 hr) HF (12 hr) | LF (1 hr) LF (12 hr) | NF (1 hr) NF (12 hr) |

As shown in Table 1, 100% germanium dioxide layers flowed at 650° C. and at 700° C. within one hour when pretreated in an argon ambient atmosphere. The layer showed an undesirable crystalline phase when treated for 12 hours at the same temperatures. Layers showed a crystalline phase when treated for one hour at 750° C. These results show that it is undesirable to use 100% germanium dioxide layers.

The 90% germanium dioxide layers also flowed at 700° C. and at 750° C. within one hour. These layers also showed a crystalline phase when treated for 12 hours at the same temperatures. These layers also showed a crystalline phase when treated for one hour at 800° C. Accordingly, these results show that 90% GeO$_2$ layers are also undesirable.

At the right side of Table 1, for 50% or less germanium dioxide, planarization did not take place for pretreatment between 800° C. and 1050° C. and for times up to 12 hours. Accordingly, these layers did not appear to reflow and are therefore undesirable for microelectronic fabrication.

The 60% germanium dioxide layer was planarized when thermally pre-treated in argon at 1000° C. for 12 hours and at 1050° C. for one hour. Although planarization was obtained, these temperatures are generally far too high for present day microelectronic fabrication processes. Accordingly, Table 1 illustrates that preferred layers of germanosilicate glass have mole percentages of germanium dioxide of between about 60% and about 85%.

Still referring to Table 1, 80% germanium dioxide is most preferred. As shown under the 80% column, which actually corresponds to a mole percentage of between about 77% and about 83%, planarization may be obtained at temperatures as low as 750° C. for planarization times of six hours. When the temperature is increased to 800° C., planarization may be obtained in three hours and when the temperature is increased to 850° C. planarization may be obtained in one hour. It will be understood that doped germanosilicate glass layers may obtain planarization at correspondingly lower temperatures. The 80% GeO$_2$ samples did not exhibit signs of a crystalline phase. It is also possible to completely planarize the 80% GeO$_2$ samples at 800° C. within three hours in argon, nitrogen and helium ambient atmospheres. The samples thermally treated in helium, nitrogen or other noble gases can yield comparable results to argon thermally treated samples.

Table 2 compares the results of thermal treatments using steam (S) according to the present invention compared to thermal treatments using forming gas (FG) comprising 8.9% hydrogen in 91.1% nitrogen. An argon thermal pretreatment was not performed prior to the steam or forming gas treatment.

TABLE 2

| | Solid Phase GeO$_2$ | | | | | | |
|---|---|---|---|---|---|---|---|
| Temp. | 100% | 90% | 80% | 60% | 50% | 40% | 20% |
| 750° C. | HF (1 hr) S HF (12 hr) S LF (1 hr) FG | — | MF (1 hr) S Planar (12 hr) S HF (1 hr) FG HF (12 hr) FG | NF (1 hr) S NF (12 hr) S NF (1 hr) FG NF (12 hr) FG | NF (1 hr) S NF (12 hr) S NF (1 hr) FG NF (12 hr) FG | NF (1 hr) S NF (12 hr) S NF (1 hr) FG NF (12 hr) FG | NF (1 hr) S NF (12 hr) S NF (1 hr) FG NF (12 hr) FG |
| 800° C. | — | — | Planar (1 hr) S Planar (12 hr) S Blowholes (1 hr) FG Blowholes (12 hr) FG | MF (1 hr) S HF (12 hr) S ~Planar (rough) (1 hr) FG ~Planar (rough) (12 hr) FG | NF (1 hr) S NF (12 hr) S NF (1 hr) FG NF (12 hr) FG | NF (1 hr) S NF (12 hr) S NF (1 hr) FG NF (12 hr) FG | NF (1 hr) S NF (12 hr) S NF (1 hr) FG NF (12 hr) FG |

Table 2 shows that approximately planar results were obtained in forming gas of 800° C. for at least one hour although the surface of the films were rough and/or contained blowholes. However, at 80% GeO$_2$, planarization was obtained using a steam thermal treatment in 12 hours at 750° C. and in one hour at 800° C. Roughness and/or blowholes were not found, so that the film is planar. In contrast, forming gas did not appear to be effective at these temperatures, compared to steam.

It has also been found that the steam treated germanosilicate glass is water insoluble over a wide range of composition variations, for example for compositions that include up to 80% germanium dioxide as deposited. Moreover, in contrast with forming gas treatment which may cause planarized germanosilicate glass to have a rough surface that includes blowholes, steam treated germanosilicate glass may exhibit a smooth surface that is free of blowholes. Finally, although the as-deposited germanosilicate glass may have high leakage current, after the steam anneal low leakage current may be present. Pretreatment followed by steam anneal further reduced leakage currents.

The results of Tables 1 and 2 are for undoped germanosilicate glass. The following tables illustrate results for doped germanosilicate glass. For the following tables, the Si and Ge concentrations are presented in the gas and solid phase mole percent. The gas phase concentrations are 50% $GeH_4$ and 50% $SiH_4$ relative to each other. Depending on the initial dopant mole percent the mole percent of the $GeH_4$ and $SiH_4$ in the gas may vary. The dopant concentrations (i.e., $PH_3$ and $BH_3$) are also presented in the gas phase mole percent relative to the total. In the body of Table 3, compositions are in the solid phase.

The films in Table 3 were subject to argon thermal pretreatment. Energy Dispersive X-Ray Spectroscopy (EDS) is used to determine the solid phase composition of doped germanosilicate samples containing only phosphorus. Auger Energy Spectroscopy (AES) is used to determine the solid phase composition of doped germanosilicate samples containing either boron or the mixture of boron and phosphorus.

At its basic level, EDS involves the generation of characteristic x-rays due to electron bombardment. The intensity of the characteristic x-rays can be analyzed to determine the relative concentration of elements from an excited specimen volume. Since these characteristic x-rays are generated over a substantial fraction of the interaction volume formed by the electrons scattering in the solid, the technique may be described as a method for determining the concentrations of elements over an average excited volume. For the present analysis, the electron incident energy is 5 KeV corresponding to an electron penetration depth of approximately 3000 Å in germanosilicate glass films.

Auger Energy Spectroscopy (AES) is used to determine the solid phase composition of doped germanosilicate samples containing either boron or the mixture of boron and phosphorus. AES is an electron energy spectroscopy that probes the electronic energy levels of atoms using electron beam stimulation. An electron beam, with energy $E_o$, irradiating a sample causes electron emissions, which can be energy analyzed to determine concentrations of elements.

| Temp | Gas Phase | | | | | |
|---|---|---|---|---|---|---|
| | (mole %) 23% $PH_3$ 38.5% $SiH_4$ 38.5% $GeH_4$ | (mole %) 5.6% $PH_3$ 47.2% $SiH_4$ 47.2% $GeH_4$ | (mole %) 23% $BH_3$ 38.5% $SiH_4$ 38.5% $GeH_4$ | (mole %) 5.6% $BH_3$ 47.2% $SiH_4$ 47.2% $GeH_4$ | (mole %) 11.5% $PH_3$ + 11.5% $BH_3$ 38.5% $SiH_4$ 38.5% $GeH_4$ | (mole %) 2.8% $PH_3$ + 2.8% $BH_3$ 47.2% $SiH_4$ 47.2% $GeH_4$ |
| As-deposited | $SiO_2$: 22 m/o $GeO_2$: 34 m/o $PO_{2.5}$: 44 m/o | $SiO_2$: 38 m/o $GeO_2$: 48 m/o $PO_{2.5}$: 14 m/o | $SiO_2$: 60 m/o $GeO_2$: 38 m/o $BO_{1.5}$: 3 m/o | $SiO_2$: 56 m/o $GeO_2$: 41 m/o $BO_{1.5}$: 2 m/o $BO_{1.5}$: 4 m/o | $SiO_2$: 41 m/o $GeO_2$: 32 m/o $PO_{2.5}$: 21 m/o $BO_{1.3}$: 4 m/o | $SiO_2$: 46 m/o $GeO_2$: 45 m/o $PO_{2.5}$: 7 m/o $BO_{1.5}$: 1 m/o |
| 600° C. | NF (1 hr) $SiO_2$: 25 m/o $GeO_2$: 33 m/o $PO_{2.5}$: 42 m/o | NF (1 hr) $SiO_2$: 37 m/o $GeO_3$: 45 m/o $PO_{2.5}$: 18 m/o | NF (1 hr) | NF (1 hr) | NF (1 hr) | NF (1 hr) |
| 700° C. | NF(1 hr) $SiO_2$:27 m/o $GeO_2$: 32 m/o $PO_{2.5}$: 40 m/o | NF(1 hr) $SiO_2$: 42 m/o $GeO_2$: 44 m/o $PO_{2.3}$: 14 m/o | NF(1 hr) | NF(1 hr) | LF(1 hr) | MF(1 hr) |
| 800° C. | MF (1 hr) $SiO_2$: 22 m/o $GeO_2$: 32m/o $PO_{2.5}$: 46m/o | ~Planar (1 hr) $SiO_2$: 42 m/o $GeO_2$: 47 m/o $PO_{2.5}$: 11 m/o | LF (1 hr) Bulk $SiO_2$:53 m/o $GeO_2$: 44 m/o $BO_{1.5}$: 3 m/0 | NF (1 hr) | Planar (1 hr) Bulk $SiO_2$: 45 m/o $GeO_2$: 32 m/o $PO_{2.5}$: 20 m/o $BO_{1.5}$: 3 m/o | Planar (1 hr) Bulk $SiO_2$:47 m/o $GeO_2$: 34 m/o $PO_{2.5}$: 6 m/o $BO_{1.5}$: 1 m/o |

Table 4 illustrates results for a steam thermal anneal. In Table 4, the Si and Ge concentrations are presented in the gas phase. The gas phase concentrations are 50% $GeH_4$ and 50% $SiH_4$ relative to each other. Depending on the initial dopant mole percent the mole percent of the $GeH_4$ and $SiH_4$ in the gas may vary. The dopant concentrations (i.e., $PH_3$ and $BH_3$) are also presented in the gas phase in mole percent. In the body of Table 4, compositions are in the solid phase.

Energy Dispersive X-Ray Spectroscopy (EDS) is used to determine the solid phase composition of undoped and doped germanosilicate samples containing only phosphorus as a dopant. This technique may be used for detecting elements with an atomic number greater than four from an excited specimen volume. Although both boron and phosphorus have atomic numbers greater than four (i.e., 5 and 15 respectively), the current EDS system was unable to detect boron. Phosphorus is detected by the EDS system.

The electrons are typically generated from the first 50 Å to 100 Å from the surface. Thus, AES may be described as a surface technique.

Film depth concentration profiling by AES is used to identify possible concentration gradients in the doped germanosilicate glasses after various thermal treatments in steam. Steam treated doped and undoped germanosilicate films exhibit a concentration gradient e.g., low-to-high concentration of germanium, boron and phosphorus, from the surface to approximately 3000 Å into the bulk of the film. The film concentration then approximates the concentrations of the as deposited germanosilicate film. Accordingly, both surface and bulk solid phase concentrations are provided in the body of Table 4. The average film thickness is about 8000 Å.

TABLE 4

| | Gas Phase | | | | | |
|---|---|---|---|---|---|---|
| Temp | (mole %) 23% PH$_3$ 38.5% SiH$_4$ 38.5% GeH$_4$ | (mole %) 5.6% PH$_3$ 47.2% SiH$_4$ 47.2% GeH$_4$ | (mole %) 23% BH$_3$ 38.5% SiH$_4$ 38.5% GeH$_4$ | (mole %) 5.6% BH$_3$ 47.2% SiH$_4$ 47.2% GeH$_4$ | (mole %) 11.5% PH$_3$ + 11.5% BH$_3$ 38.5% SiH$_4$ 38.5% GeH$_4$ | (mole %) 2.8% PH$_3$ + 2.8% BH$_3$ 47.2% SiH$_4$ 47.2% GeH$_4$ |
| As-deposited | SiO$_2$: 22 m/o GeO$_2$: 34 m/o PO$_{2.5}$: 44 m/o | SiO$_2$: 38 m/o GeO$_2$: 48 m/o PO$_{2.5}$: 14 m/o | SiO$_2$: 56 m/o GeO$_2$: 41 m/o BO$_{1.5}$: 2 m/o | SiO$_2$: 41 m/o GeO$_2$: 32 m/o PO$_{2.5}$: 2 m/o | SiO$_2$: 41 m/o GeO$_2$: 45 m/o PO$_{2.5}$: 7 m/o BO$_{1.5}$: 4 m/o | SiO2: 46 m/o GeO$_2$: 45 m/o PO$_{2.5}$: 7 m/o BO$_{1.5}$: 1 m/o |
| 750° C. | MF(1 hr) SiO$_2$: 58 m/o GeO$_2$: 18 m/o PO$_{2.5}$: 24 m/o | HF(1 hr) SiO$_2$: 49 m/o GeO$_2$: 41 m/o PO$_{2.5}$:11 m/o | LF(1 hr) | NF(1 hr) | Planar(1 hr) Surface SiO$_2$: 55 m/o GeO$_2$: 4 m/o PO$_{2.5}$: 40 m/o BO$_{1.5}$: 4 m/o Bulk SiO$_2$: 28 m/o GeO$_2$: 56 m/o PO$_{2.5}$: 13 m/o BO$_{1.5}$: 3 m/o | ~Planar(1 hr) Surface SiO$_2$: 95 m/o GeO$_2$: 3 m/o PO$_{2.5}$: 2 m/o BO$_{1.5}$: 0 m/o Bulk SiO$_2$: 55 m/o GeO$_2$: 35 m/o PO$_{2.5}$: 8 m/o BO$_{1.5}$: 2 m/o |
| 800° C. | MF(1 hr) SiO$_2$: 83 m/o GeO$_2$: 13 m/o PO$_{2.5}$: 4 m/o | Planar(1 hr) SiO$_2$: 58 m/o GeO$_2$: 33 m/o PO$_{2.5}$: 9 m/o | HF(1 hr) | NF(1 hr) | — | Planar(1 hr) Surface SiO$_2$: 93 m/o GeO$_2$: 7 m/o PO$_{2.5}$: 0 m/o BO$_{1.5}$: 0 m/o Bulk SiO$_2$: 40 m/o GeO$_2$: 47 m/o PO$_{2.5}$: 12 m/o BO$_{1.5}$: 1 m/o |

Thus, for equal amounts of silane and germane in the gas phase, planarization was obtained using phosphorous and boron doping at 750° C. after one hour, and at 800° C. using only phosphorous. This contrasts sharply with Tables 1 and 2 where planarization was not obtained for 50% GeH$_4$ germanosilicate glass at 1050° C. Accordingly, the reflow temperature is reduced considerably by introducing boron and/or phosphorous dopants.

Table 5 illustrates the reflow effect of dopants on 80% germanium dioxide germanosilicate glass. In Table 5, the silicon and germanium concentrations of 80% GeH$_4$ and 20% SiH$_4$ are represented in the gas phase. The dopant concentrations of PH$_3$ and BH$_3$ are also represented in the gas phase relative to the total composition.

Table 5 clearly indicates that the minimum reflow temperature in which the doped germanosilicate glass layers are planarized is 550° C. These layers were planarized within 12 hours in an argon thermal pretreatment. The corresponding gas phase composition for the dopants are 11.5% PH$_3$ and 11.5% BH$_3$ relative to the total. The same composition is completely planar at 575° C. within three hours in an argon thermal pretreatment. They are also completely planar in the temperature range 600° C. to 800° C. within one hour in an argon thermal pretreatment. The 2.3% PH$_3$ and 2.3% BH$_3$ composition is also completely planar at 650° C. within three hours and at 700° C. to 850° C. within one hour in an argon thermal pretreatment. There are no steam or forming gas thermal treatments in Table 5. Accordingly, the planarization temperature has been reduced from about 750° C. to about 550° C. with the addition of boron and phosphorous dopants.

TABLE 5

| | Gas Phase | | | | | |
|---|---|---|---|---|---|---|
| Temp. | (mole %) 23% PH$_3$ 15% SiH$_4$ 62% GeH$_4$ | (mole %) 5.6% PH$_3$ 19% SiH$_4$ 75.4% GeH$_4$ | (mole %) 23% BH$_3$ 15% SiH$_4$ 62% GeH$_4$ | (mole %) 5.6% BH$_3$ 19% SiH$_4$ 75.4% GeH$_4$ | (mole %) 11.5% PH$_3$ + 11.5% BH$_3$ 15% SiH$_4$ 62% GeH$_4$ | (mole %) 2.8% PH$_3$ + 2.7% BH$_3$ 19% SiH$_4$ 75.4% GeH$_4$ |
| As-deposited | SiO$_2$: 9 m/o GeO$_2$: 66 m/o PO$_{2.5}$: 25 m/o | SiO$_2$: 13 m/o GeO$_2$: 74 m/o PO$_{2.5}$: 14 m/o | SiO$_2$:19 m/o GeO$_2$: 78 m/o BO$_{1.5}$:3 m/o | SiO$_2$: 25 m/o GeO$_2$: 73 m/o BO$_{1.5}$:2 m/o | SiO$_2$: 14 m/o GeO$_2$: 73 m/o PO$_{2.5}$: 12 m/o BO$_{1.5}$: 1 m/o | SiO$_2$: 16 m/o GeO$_2$: 77 m/o PO$_{2.5}$: 6 m/o BO$_{1.5}$: 0 m/o |
| 550° C. | — | — | — | — | NF(1 hr) HF (12 hr) .9 μm Planar (12 hr) .5 μm | — |
| 575° C. | — | — | — | — | HF (1 hr) Planar (3 hr) | — |
| 600° C. | LF (1 hr) SiO$_2$: 11 m/o GeO$_2$: 66 m/o | NF (1 hr) SiO$_2$: 17 m/o GeO$_2$: 69 m/o | NF (1 hr) | NF (1 hr) | Planar (1 hr) Bulk SiO$_2$: 13 m/o | NF (1 hr) |

TABLE 5-continued

| Temp. | Gas Phase | | | | | |
|---|---|---|---|---|---|---|
| | (mole %) 23% PH$_3$ 15% SiH$_4$ 62% GeH$_4$ | (mole %) 5.6% PH$_3$ 19% SiH$_4$ 75.4% GeH$_4$ | (mole %) 23% BH$_3$ 15% SiH$_4$ 62% GeH$_4$ | (mole %) 5.6% BH$_3$ 19% SiH$_4$ 75.4% GeH$_4$ | (mole %) 11.5% PH$_3$ + 11.5% BH$_3$ 15% SiH$_4$ 62% GeH$_4$ | (mole %) 2.8% PH$_3$ + 2.7% BH$_3$ 19% SiH$_4$ 75.4% GeH$_4$ |
| | PO$_{2.5}$: 24 m/o | PO$_{2.5}$: 14 m/o | | | GeO$_2$: 75 m/o PO$_{2.5}$: 10 m/o BO$_{1.5}$: 2 m/o | |
| 625° C. | — | — | — | — | — | MF (1 hr) HF (12 hr) |
| 650° C. | — | — | — | — | Planar (1 hr) | HF (1 hr) Planar (3 hr) |
| 700° C. | MF (1 hr) SiO$_2$: 14 m/o GeO$_2$: 60 m/o PO$_{2.5}$: 26 m/o | MF(1 hr) SiO$_2$: 14 m/o GeO$_2$: 72 m/o PO$_{2.5}$: 14 m/o | HF(1 hr) | Planar (1 hr) | Planar (1 hr) Bulk SiO$_2$: 24 m/o GeO$_2$: 63 m/o GeO$_2$: 63 m/o PO$_{2.5}$: 10 m/o BO$_{1.5}$: 3 m/o | Bulk SiO$_2$: 24 m/o SiO$_2$: 24 m/o GeO$_2$: 67 m/o PO$_{2.5}$: 8 m/o BO$_{1.5}$: 0 m/o |
| 800° C. | C (1 hr) SiO$_2$: 8 m/o GeO$_2$: 52 m/o PO$_{2.5}$: 40 m/o | ~Planar (1 hr) SiO$_2$: 12 m/o GeO$_2$: 65 m/o PO$_{2.5}$: 23 m/o | Planar (1 hr) Bulk SiO$_2$: 23 m/o GeO$_2$: 76 m/o BO$_{1.5}$: 1 m/o | ~Planar (1 hr) Bulk SiO$_2$: 21 m/o GeO$_2$: 76 m/o BO$_{1.5}$: 2 m/o | Planar (1 hr) | Planar (1 hr) |

Table 6 illustrates a two step method in which doped and undoped germanosilicate glass films are planarized by a thermal pretreatment in a noble gas, and then germanium, boron and phosphorus are partially removed from the glass films by thermal treatment in steam without jeopardizing the integrity of the planarized films. More specifically, the two step method planarizes the as-deposited films in a noble gas, i.e., in argon or helium, then thermally treats the films in steam to partially remove germanium, boron, and phosphorus.

| Temp | Gas Phase | | |
|---|---|---|---|
| | (mole %) Undoped 20% SiH$_4$ 80% GeH$_4$ | (mole %) 11.5% PH$_3$ + 11.5% BH$_3$ 38.5% SiH$_4$ 38.5% GeH$_4$ | (mole%) 11.5% PH$_3$ + 11.5% BH$_3$ 15% SiH$_4$ 62% GeH$_4$ |
| As-deposited | SiO$_2$: 17 m/o GeO$_2$: 83 m/o | SiO$_2$: 41 m/o GeO$_2$: 32 m/o PO$_{2.5}$: 21 m/o BO$_{1.5}$: 4 m/o | SiO$_2$: 14 m/o GeO$_2$: 73 m/o PO$_{2.5}$: 12 m/o BO$_{1.5}$: 1 m/o |
| First Step 600° C. | — | — | Planar (1 hr) Argon Surface SiO$_2$: 10 m/o GeO$_2$: 65 m/o PO$_{2.5}$: 23 m/o BO$_{1.5}$: 2 m/o Bulk SiO$_2$: 11 m/o GeO$_2$: 67 m/o PO$_{2.5}$: 18 m/o BO$_{1.5}$: 4 m/o |
| First Step 800° C. | Planar (1 hr) Helium (EDS) SiO$_2$: 17 m/o GeO$_2$: 83 m/o | Planar (1 hr) Argon Surface SiO$_2$: 66 m/o GeO$_2$: 24 m/o PO$_{2.5}$: 8 m/o BO$_{1.5}$: 2 m/o Bulk SiO$_2$: 45 m/o GeO$_2$: 32 m/o PO$_{2.5}$: 20 m/o BO$_{1.5}$: 3 m/o | — |
| Second Step 750° C. Steam Only | Planar (1 hr) (EDS) SiO$_2$: 21 m/o GeO$_2$: 79 m/o (AES) Surface | Planar (1 hr) Surface SiO$_2$: 61 m/o GeO$_2$: 25 m/o PO$_{2.5}$: 13 m/o BO$_{1.5}$: 13 m/o | Planar(1 hr) Surface SiO$_2$: 58 m/o GeO$_2$: 37 m/o PO$_{2.5}$: 4 m/o BO$_{1.5}$: 1 m/o |

-continued

| | Gas Phase | | |
|---|---|---|---|
| Temp | (mole %) Undoped 20% $SiH_4$ 80% $GeH_4$ | (mole %) 11.5% $PH_3$ + 11.5% $BH_3$ 38.5% $SiH_4$ 38.5% $GeH_4$ | (mole%) 11.5% $PH_3$ + 11.5% $BH_3$ 15% $SiH_4$ 62% $GeH_4$ |
| | $SiO_2$: 35 m/o $GeO_2$: 65 m/o Bulk $GeO_2$: 76 m/o | Bulk $SiO_2$: 55 m/o $GeO_2$: 35 m/o $PO_{2.5}$: 10 m/o $BO_{1.5}$: 0 m/o | Bulk $SiO_2$: 44 m/o $GeO_2$: 48 m/o $PO_{2.5}$: 15 m/o $BO_{1.5}$: 3 m/o |

The first process, corresponding to the first column of Table 6, involves planarizing an undoped 80%$GeO_2$ glass film in helium at 800° C. for 1 hour (first step). There is no concentration gradient of either the as-deposited film or the helium thermally treated sample. After thermally treating the film in steam for 1 hour at 750° C. (second step) approximately 14% of the $GeO_2$ is lost, thus raising the temperature by which the film can be planarized to greater than 1000° C. It has also been shown that after steam thermal treatment at 750° C., the film is insoluble in water. EDS was used to characterize the film before steam thermal treatment and EDS and AES were used to characterize the steam treated sample.

The next process, corresponding to the second column of Table 6, involves planarizing a doped germanosilicate glass film in argon at 800° C. for 1 hour (first step) then thermally treating the film in steam for 1 hour at 750° C. (second step). There is no noticeable change in the $GeO_2$ concentration after steam thermal treatment. However there is a complete loss of boron after the steam thermal treatment. Although there is no apparent loss of $GeO_2$ after the steam thermal treatment, it is possible that the reflow temperature of the film is increased due to the loss of boron. The film has been shown to be insoluble in water after a steam thermal treatment at 750° C. for 1 hour.

The final process, corresponding to the third column of Table 6, involves planarizing a doped germanosilicate glass film in argon at 600° C. for 1 hour (first step) then thermally treating the film in steam for 1 hour at 750° C. (second step). There is no concentration gradient observed in either the as-deposited film or the argon thermally treated sample. After thermally treating the film in steam for 1 hour at 750° C. approximately 43% of the $GeO_2$ is lost, while the boron and phosphorus are completely lost. Thus, the temperature at which the film can be reflowed is greatly increased.

The above data shows that when boron is used to dope the germanosilicate glass, the boron-doped germanosilicate glass preferably has a mole percentage of germanium dioxide of between about 40% and about 85% relative to the silicon dioxide which encompasses reflow and crystallization boundaries, respectively, and a mole percentage of boron as $BO_{1.5}$ of between about 1% and about 4% relative to the total borogermanosilicate glass ($GeO_2+SiO_2+BO_{1.5}$). More preferably, the layer of boron-doped germanosilicable glass has a mole percentage of germanium dioxide of between about 77% and about 83% relative to the silicon dioxide and mole percentage of boron of about 3 percent relative to the total borogermanosilicate glass ($GeO_2+SiO_2+BO_{1.5}$).

The above data also shows that when phosphorus is used to dope the germanosilicate glass, the phosphorous doped germanosilicate glass preferably has mole percentage of germanium dioxide of between about 60% and about 85% relative to silicon dioxide and mole percentages of phosphorous as $PO_{2.5}$ of between about 14% and about 44% relative to the total phosphogermanosilicate glass ($GeO_2+SiO_2+PO_{2.5}$). More preferably, the phosphorous doped germanosilicate glass has mole percentage of germanium dioxide relative to silicon dioxide of between about 55% and about 85% and mole percentage of phosphorous of about 14% of the total phosphogermanosilicate glass ($GeO_2+SiO_2+PO_{2.5}$).

The above data also shows that both boron and phosphorus preferably are used in combination to dope the germanosilicate glass. The boron and phosphorus doped germanosilicate glass preferably has a mole percentage of germanium dioxide of between about 40% and about 85% relative to the silicon dioxide, a mole percentage of phosphorus as $PO_{2.5}$ of between about 5% and about 23%, and mole percentage of boron as $BO_{1.5}$ of between about 1% and about 4%, both relative to the total borophosphogermanosilicate glass ($GeO_2+SiO_2+PO_{2.5}+BO_{1.5}$) More preferably, the layer of boron and phosphorus doped germanosilicate glass has a mole percentage of germanium dioxide of between about 82% and about 85% relative to silicon dioxide, a mole percentage of phosphorus as $PO_{2.5}$ of between about 11% and about 14% and a mole percentage of boron as $BO_{1.5}$ of between about 1% and 3%, both relative to the total borophosphogermanosilicate glass ($GeO_2+SiO_2+PO_{2.5}+BO_{1.5}$).

Examples of the effect of thermal treatment in steam on a layer of germanosilicate glass in forming a hierarchy of germanosilicate glass layers will now be described. The following examples are merely illustrative and should not be construed as limiting the invention.

EXAMPLE 1

This example forms three layers of undoped germanosilicate glass using thermal treatment in steam. A first layer of germanosilicate glass comprising 80% germanium dioxide is formed on a substrate, for example using PECVD at 200° C. Thermal treatment in steam is performed at 750° C. for twelve hours to planarize the layer of germanosilicate glass and to also remove about 15% of the germanium from the germanosilicate glass to thereby raise the reflow temperature of the germanosilicate glass so treated to about 950° C. Thus, the thermal treatment in steam planarizes the layer of germanosilicate glass and also raises the reflow temperature by about 200° C. The second and third layers of germanosilicate glass may be formed and thermally treated at 750° C. for 12 hours without disturbing the underlying germanosilicate glass layer.

EXAMPLE 2

In this example, a layer of 80% $GeO_2$ undoped germanosilicate glass is formed on a substrate, for example using PECVD at 200° C. A thermal treatment in steam is performed at 800° C. for one hour to thereby raise the reflow temperature of the germanosilicate glass to about 950° C. and planarize the germanosilicate glass. About 15% of the germanium dioxide is removed so that the thermally treated germanosilicate glass includes 65% germanium oxide. The same process may be used to form and treat second and subsequent layers of germanosilicate glass without disturbing the underlying layers.

EXAMPLE 3

Example 3 illustrates methods of forming all layers of undoped germanosilicate glass using thermal pretreatment in a noble gas followed by thermal treatment in steam. In particular, a layer of germanosilicate glass is formed on a substrate, for example by PECVD at 200° C. A thermal pretreatment is performed in argon at 850° C. for one hour to reflow the germanosilicate glass. Then a thermal treatment in steam is performed at 800° C. for one hour to thereby remove about 15% of the germanium dioxide to provide 65% $GeO_2$ in the germanosilicate glass. This raises the reflow temperature to 950° C. Subsequent germanosilicate glass layers may be formed, reflowed in a thermal pretreatment and thermally treated in steam under the process conditions described above without disturbing the underlying germanosilicate glass layer. It has been found that when performing the two-step pretreating and treating process, lower leakage and higher breakdown properties may be obtained compared to a thermal treatment process alone.

Accordingly, the present invention can provide planarized reflow of doped and undoped germanosilicate glasses, the composition of which can be altered after reflow and the interfacial stress of which can be modulated and maintained at low stress levels. Planarization and composition modulation may be controlled independently. Planar reflow glass structures over nonplanar topography may therefore be achieved at temperatures as low as 600° C. or less. Such planarized glasses can exhibit low stress and low solubility. The same processes and structures may be used for trench isolation, interlayer dielectrics and capping layers.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a layer on a substrate comprising the steps of:
    forming a layer of germanosilicate glass on a substrate;
    pretreating the layer of germanosilicate glass in at least one of a noble gas and nitrogen gas to reflow the layer of germanosilicate glass; and then
    thermally treating the thermally pretreated layer of germanosilicate glass in steam to remove germanium from the germanosilicate glass and thereby raise the reflow temperature of the germanosilicate glass so treated.

2. A method according to claim 1:
    wherein the forming step comprises the step of forming a nonplanar layer of germanosilicate glass on a substrate;
    wherein the thermally pretreating step comprises the step of thermally pretreating the nonplanar layer of germanosilicate glass in at least one of a noble gas and nitrogen gas to reflow the nonplanar layer of germanosilicate glass and partially planarize the nonplanar layer of germanosilicate glass; and
    wherein the thermally treating step comprises the step of thermally treating the partially planarized layer of germanosilicate glass in steam to remove germanium from the partially planarized germanosilicate glass and to fully planarize the partially planarized germanosilicate glass.

3. A method according to claim 1:
    wherein the forming step comprises the step of forming a nonplanar layer of germanosilicate glass on a substrate;
    wherein the thermally pretreating step comprises the step of thermally pretreating the nonplanar layer of germanosilicate glass in at least one of a noble gas and nitrogen gas to reflow the nonplanar layer of germanosilicate glass and fully planarize the nonplanar layer of germanosilicate glass; and
    wherein the thermally treating step comprises the step of thermally treating the fully planarized layer of germanosilicate glass in steam to remove germanium from the fully planarized germanosilicate glass.

4. A method of forming a layer on a substrate comprising the steps of:
    forming a layer of germanosilicate glass on a substrate using Plasma Enhanced Chemical Vapor Deposition (PECVD) at about 200° C.; and
    thermally treating the layer of germanosilicate glass in steam to remove germanium from the germanosilicate glass and thereby raise the reflow temperature of the germanosilicate glass so treated.

5. A method of forming a layer on a substrate comprising the steps of:
    forming a layer of germanosilicate glass having mole percentage of germanium dioxide of between about 60% and about 85% on a substrate; and
    thermally treating the layer of germanosilicate glass in steam to remove germanium from the germanosilicate glass and thereby raise the reflow temperature of the germanosilicate glass so treated.

6. A method according to claim 5 wherein the forming step comprises the step of forming a layer of germanosilicate glass having mole percentage of germanium dioxide of between about 77% and about 83%.

7. A method according to claim 3:
    wherein the forming step comprises the step of forming a nonplanar layer of doped germanosilicate glass on a substrate, the doped germanosilicate glass having lower reflow temperature than undoped germanosilicate glass; and
    wherein the thermally treating step comprises the step of thermally treating the nonplanar layer of doped germanosilicate glass in steam to planarize the nonplanar layer of doped germanosilicate glass and to remove at least one of germanium and dopant from the germanosilicate glass and thereby raise the reflow temperature of the doped germanosilicate glass so treated.

8. A method of forming a layer on a substrate comprising the steps of:
    forming a layer of boron doped germanosilicate glass having mole percentage of germanium dioxide relative to silicon dioxide of between about 40% and about 85% and mole percentage of boron of between about 1% and about 4% relative to the total on a substrate; and
    thermally treating the layer of doped germanosilicate glass in steam to remove at least one of germanium and dopant from the germanosilicate glass and thereby raise the reflow temperature of the doped germanosilicate glass so treated.

9. A method according to claim 8 wherein the forming step comprises the step of forming a layer of boron doped germanosilicate glass having mole percentage of germanium dioxide relative to silicon dioxide of between about 77% and about 83% and mole percentage of boron of about 3% relative to the total.

10. A method of forming a layer on a substrate comprising the steps of:
    forming a layer of phosphorous doped germanosilicate glass having mole percentage of germanium dioxide relative to silicon dioxide of between about 60% and about 85% and mole percentage of phosphorous of between about 14% and about 44% relative to the total on a substrate; and
    thermally treating the layer of doped germanosilicate glass in steam to remove at least one of germanium and dopant from the germanosilicate glass and thereby raise the reflow temperature of the doped germanosilicate glass so treated.

11. A method according to claim 10 wherein the forming step comprises the step of forming a layer of phosphorous doped germanosilicate glass having mole percentage of germanium dioxide relative to silicon dioxide of between about 60% and about 85% and mole percentage of phosphorous of about 14% relative to the total.

12. A method of forming a layer on a substrate comprising the steps of:
    forming a layer of boron and phosphorus doped germanosilicate glass having mole percentage of germanium dioxide relative to silicon dioxide of between about 40% and about 85%, mole percentage of boron of between about 1% and about 4% relative to the total, and mole percentage of phosphorous of between about 5% and about 23% relative to the total on the substrate; and
    thermally treating the layer of doped germanosilicate glass in steam to remove at least one of germanium and dopant from the germanosilicate glass and thereby raise the reflow temperature of the doped germanosilicate glass so treated.

13. A method according to claim 12 wherein the forming step comprises the step of forming a layer of boron and phosphorus doped germanosilicate glass having mole percentage of germanium dioxide relative to silicon dioxide of between about 82% and about 85%, mole percentage of boron of between about 1% and about 3% relative to the total, and mole percentage of phosphorus of between about 11% and about 14% relative to the total.

14. A method of forming a plurality of germanosilicate glass layers on a substrate, comprising the steps of:
    forming a layer of germanosilicate glass on a substrate;
    thermally treating the layer of germanosilicate glass in steam to remove germanium from the germanosilicate glass and thereby raise the reflow temperature of the germanosilicate glass so treated; and
    repeating the steps of forming and thermally treating to thereby create a hierarchy of thermally treated germanosilicate glass layers on the substrate, wherein each thermally treated germanosilicate glass layer has higher reflow temperature than the corresponding layer of germanosilicate glass as formed.

15. A method according to claim 14 wherein each of the repeated forming and thermally treating steps are performed under same conditions.

16. A method according to claim 14 wherein at least two of the repeated thermally treating steps are performed under differing thermal conditions.

17. A method according to claim 14:
    wherein the thermally treating step is preceded by the step of thermally pretreating the layer of germanosilicate glass in at least one of a noble gas and nitrogen gas to reflow the layer of germanosilicate glass; and
    wherein the repeating step comprises the steps of repeating the steps of forming, thermally pretreating and thermally treating to thereby create a plurality of thermally treated reflowed germanosilicate glass layers on the substrate, wherein each thermally treated reflowed germanosilicate glass layer has higher reflow temperature than the corresponding layer of germanosilicate glass as formed.

18. A method according to claim 17:
    wherein the forming step comprises the step of forming a nonplanar layer of germanosilicate glass on a substrate;
    wherein the thermally pretreating step comprises the step of thermally pretreating the nonplanar layer of germanosilicate glass in at least one of a noble gas and nitrogen gas to reflow the nonplanar layer of germanosilicate glass and partially planarize the nonplanar layer of germanosilicate glass; and
    wherein the thermally treating step comprises the step of thermally treating the partially planarized layer of germanosilicate glass in steam to remove germanium from the partially planarized germanosilicate glass and to fully planarize the partially planarized germanosilicate glass.

19. A method according to claim 17:
    wherein the forming step comprises the step of forming a nonplanar layer of germanosilicate glass on a substrate;
    wherein the thermally pretreating step comprises the step of thermally pretreating the nonplanar layer of germanosilicate glass in at least one of a noble gas and nitrogen gas to reflow the nonplanar layer of germanosilicate glass and fully planarize the nonplanar layer of germanosilicate glass; and
    wherein the thermally treating step comprises the step of thermally treating the fully planarized layer of germanosilicate glass in steam to remove germanium from the fully planarized germanosilicate glass.

20. A method according to claim 14 wherein the forming step comprises the step of forming a layer of germanosilicate glass on a substrate using Plasma Enhanced Chemical Vapor Deposition (PECVD) at about 200° C.

21. A method according to claim 14 wherein the forming step comprises the step of forming a layer of germanosilicate glass having mole percentage of germanium dioxide of between about 60% and about 85%.

22. A method according to claim 14 wherein the forming step comprises the step of forming a layer of germanosilicate glass having mole percentage of germanium dioxide of between about 77% and about 83%.

23. A method according to claim 14:
    wherein the forming step comprises the step of forming a layer of doped germanosilicate glass on a substrate, the doped germanosilicate glass having lower reflow temperature than undoped germanosilicate glass; and
    wherein the thermally treating step comprises the step of thermally treating the layer of doped germanosilicate glass in steam to remove at least one of germanium and dopant from the germanosilicate glass and thereby raise the reflow temperature of the doped germanosilicate glass so treated.

24. A method according to claim 23 wherein the forming step comprises the step of forming a layer of boron doped germanosilicate glass having mole percentage of germanium dioxide relative to silicon dioxide of between about 40% and about 85% and mole percentage of boron of between about 1% and about 4% relative to the total.

25. A method according to claim 23 wherein the forming step comprises the step of forming a layer of boron doped germanosilicate glass having mole percentage of germanium dioxide relative to silicon dioxide of between about 77% and about 83% and mole percentage of boron of about 3% relative to the total.

26. A method according to claim 23 wherein the forming step comprises the step of forming a layer of phosphorous doped germanosilicate glass having mole percentage of germanium dioxide relative to silicon dioxide of between about 60% and about 85% and mole percentage of phosphorous of about 14% and about 44% relative to the total.

27. A method according to claim 23 wherein the forming step comprises the step of forming a layer of phosphorous doped germanosilicate glass having mole percentage of germanium dioxide relative to silicon dioxide of between about 60% and about 85% and mole percentage of phosphorous of about 14% relative to the total.

28. A method according to claim 23 wherein the forming step comprises the step of forming a layer of boron and phosphorus doped germanosilicate glass having mole percentage of germanium dioxide relative to silicon dioxide of between about 40% and about 85%, mole percentage of boron of between about 1% and about 4% relative to the total, and mole percentage of phosphorus of between about 5% and about 23% relative to the total.

29. A method according to claim 23 wherein the forming step comprises the step of forming a layer of boron and phosphorus doped germanosilicate glass having mole percentage of germanium dioxide relative to silicon dioxide of between about 82% and about 85%, mole percentage of boron of between about 1% and about 3% relative to the total, and mole percentage of phosphorus of between about 11% and about 14% relative to the total.

30. A method according to claim 14:
wherein the thermally treating step is followed by the step of forming a conductive layer on the thermally treated layer of germanosilicate glass; and
wherein the repeating step comprises the step of repeating the steps of forming a layer of germanosilicate glass, thermally treating and forming a conductive layer to thereby create a hierarchy of thermally treated germanosilicate glass layers on the substrate, that are separated by conductive layers, wherein each thermally treated germanosilicate glass layer has higher reflow temperature than the corresponding layer of germanosilicate glass as formed.

31. A method of forming a plurality layers on a substrate, comprising the steps of:
forming a layer of glass on a substrate, the glass including at least two compounds in solid solution, one of which is volatilized by steam;
thermally treating the layer of glass in steam to remove at least some of the compound which is volatilized by steam from the glass and thereby raise the reflow temperature of the glass so treated; and
repeating the steps of forming and thermally treating to thereby create a hierarchy of thermally treated glass layers on the substrate, wherein each thermally treated glass layer has higher reflow temperature than the corresponding layer of glass as formed.

32. A method according to claim 31 wherein each of the repeated forming and thermally treating steps are performed under same conditions.

33. A method according to claim 31 wherein at least two of the repeated thermally treating steps are performed under differing thermal conditions.

34. A method according to claim 31:
wherein the thermally treating step is followed by the step of forming a conductive layer on the thermally treated layer of glass; and
wherein the repeating step comprises the step of repeating the steps of forming a layer of glass, thermally treating and forming a conductive layer to thereby create a plurality of thermally treated glass layers on the substrate, that are separated by conductive layers, wherein each thermally treated glass layer has higher reflow temperature than the corresponding layer of glass as formed.

35. A method according to claim 31 wherein a first one of the thermally treated glass layers has higher dielectric constant than a second one of the thermally treated glass layers.

36. A method according to claim 35 wherein the first one of the thermally treated glass layers comprises at least one of germanotitanate and germanostannate glass and wherein the second one of the thermally treated glass layers comprises germanosilicate glass.

37. A method of forming a layer on a substrate comprising the steps of:
forming a layer of germanium-containing glass on a substrate;
thermally pretreating the layer of germanium-containing glass in at least one of a noble gas and nitrogen gas to reflow the layer of germanium-containing glass and then
thermally treating the layer of germanium-containing glass in steam to remove germanium from the germanium-containing glass and thereby raise the reflow temperature of the germanium-containing glass so treated.

38. A method according to claim 37:
wherein the forming step comprises the step of forming a nonplanar layer of germanium-containing glass on a substrate;
wherein the thermally pretreating step comprises the step of thermally pretreating the nonplanar layer of germanium-containing glass in at least one of a noble gas and nitrogen gas to reflow the nonplanar layer of germanium-containing glass and partially planarize the nonplanar layer of germanium-containing glass; and
wherein the thermally treating step comprises the step of thermally treating the partially planarized layer of germanium-containing glass in steam to remove germanium from the partially planarized germanium-containing glass and to fully planarize the partially planarized germanium-containing glass.

39. A method according to claim 37:
wherein the forming step comprises the step of forming a nonplanar layer of germanium-containing glass on a substrate;
wherein the thermally pretreating step comprises the step of thermally pretreating the nonplanar layer of germanium-containing glass in at least one of a noble gas and nitrogen gas to reflow the nonplanar layer of germanium-containing glass and fully planarize the nonplanar layer of germanium-containing glass; and
wherein the thermally treating step comprises the step of thermally treating the fully planarized layer of germanium-containing glass in steam to remove germanium from the fully planarized germanium-containing glass.

40. A method of forming a layer on a substrate comprising the steps of:

forming a layer of germanium-containing glass on a substrate; and thermally treating the layer of germanium-containing glass in steam to remove germanium from the germanium-containing glass and thereby raise the reflow temperature of the germanium-containing glass so treated;

wherein the germanium-containing glass comprises at least one of germanotitanate glass and germanostannate glass.

41. A method according to claim 37 wherein the forming step comprises the step of lining a trench in the substrate with a layer of germanium-containing glass.

42. A method according to claim 37 wherein the thermally treating step is followed by the step of forming a contact on the layer of thermally treated germanium-containing glass, opposite the substrate, to thereby form a capacitor.

43. A method according to claim 40 wherein the thermally treating step is followed by the step of forming a contact on the layer of thermally treated germanium-containing glass, opposite the substrate, to thereby form a capacitor.

44. A method according to claim 41 wherein the thermally treating step is followed by the step of:

forming a contact on the layer of thermally treated germanium-containing glass in the trench, opposite the substrate, to thereby form a capacitor.

* * * * *

UNITED STATES PATENT AND TRADEMARK OFFICE
CERTIFICATE OF CORRECTION

PATENT NO. : 6,271,150 B1
DATED : August 7, 2001
INVENTOR(S) : Croswell et al.

It is certified that error appears in the above-identified patent and that said Letters Patent is hereby corrected as shown below:

Column 24,
Line 43, please change "claim 3" to -- claim 1 --.

Signed and Sealed this

Thirteenth Day of July, 2004

JON W. DUDAS
*Acting Director of the United States Patent and Trademark Office*